(12) United States Patent
Kimura et al.

(10) Patent No.: US 8,390,920 B2
(45) Date of Patent: Mar. 5, 2013

(54) LASER DEVICE, LASER DISPLAY APPARATUS, LASER RADIATING APPARATUS, AND NONLINEAR OPTICAL ELEMENT

(75) Inventors: Kaoru Kimura, Tokyo (JP); Akio Furukawa, Tokyo (JP); Michio Oka, Tokyo (JP)

(73) Assignee: Sony Corporation, Tokyo (JP)

( * ) Notice: Subject to any disclaimer, the term of this patent is extended or adjusted under 35 U.S.C. 154(b) by 383 days.

(21) Appl. No.: 12/697,023

(22) Filed: Jan. 29, 2010

(65) Prior Publication Data

US 2010/0220384 A1 Sep. 2, 2010

(30) Foreign Application Priority Data

Feb. 27, 2009 (JP) .................................. 2009-047028

(51) Int. Cl.
G02F 1/37 (2006.01)
G02F 1/35 (2006.01)
(52) U.S. Cl. ........... 359/326; 359/328; 372/21; 372/102
(58) Field of Classification Search .................. 385/122; 359/315, 326–332; 372/21, 102
See application file for complete search history.

(56) References Cited

U.S. PATENT DOCUMENTS

| 5,185,752 | A | | 2/1993 | Welch et al. |
| 5,987,041 | A | * | 11/1999 | Taniguchi et al. ............... 372/12 |
| 7,492,507 | B1 | * | 2/2009 | Gollier .......................... 359/326 |
| 7,693,193 | B2 | * | 4/2010 | Kamijima ....................... 372/22 |
| 8,057,051 | B2 | * | 11/2011 | Sumiyama et al. ............. 353/85 |
| 8,228,960 | B2 | * | 7/2012 | Furukawa et al. .............. 372/22 |

FOREIGN PATENT DOCUMENTS

| JP | 08-211433 | 8/1996 |
| JP | 2004-125943 | 4/2004 |
| JP | 2004-233534 | 8/2004 |
| JP | 2007-173769 | 7/2007 |
| JP | 2007-322695 | 12/2007 |
| JP | 2008-028380 | 2/2008 |
| JP | 2008-085298 | 4/2008 |
| JP | 2008-522445 | 6/2008 |

* cited by examiner

Primary Examiner — Daniel Petkovsek
(74) Attorney, Agent, or Firm — Robert J. Depke; The Chicago Technology Law Group, LLC

(57) ABSTRACT

A laser device, includes: a fundamental wave generating portion configured to generate a plurality of fundamental waves having wavelengths which are different from each other in at least one set thereof, the fundamental wave generating portion having a semiconductor laser having a plurality of luminous points, and a Bragg reflection structure; and a nonlinear optical element in which a poling structure adapted to pseudophase matching for the wavelengths of the plurality of fundamental waves emitted from the fundamental wave generating portion, respectively, is formed variatively along a propagating direction of the plurality of fundamental waves.

12 Claims, 13 Drawing Sheets

WAVELENGTH OF SECOND-ORDER HARMONIC

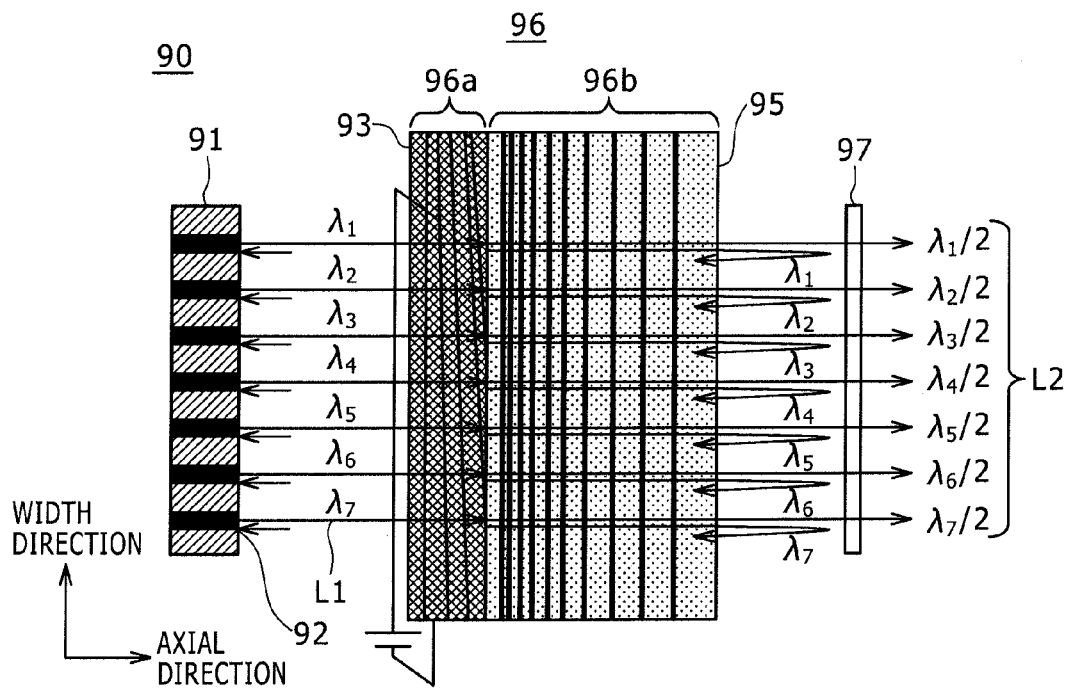
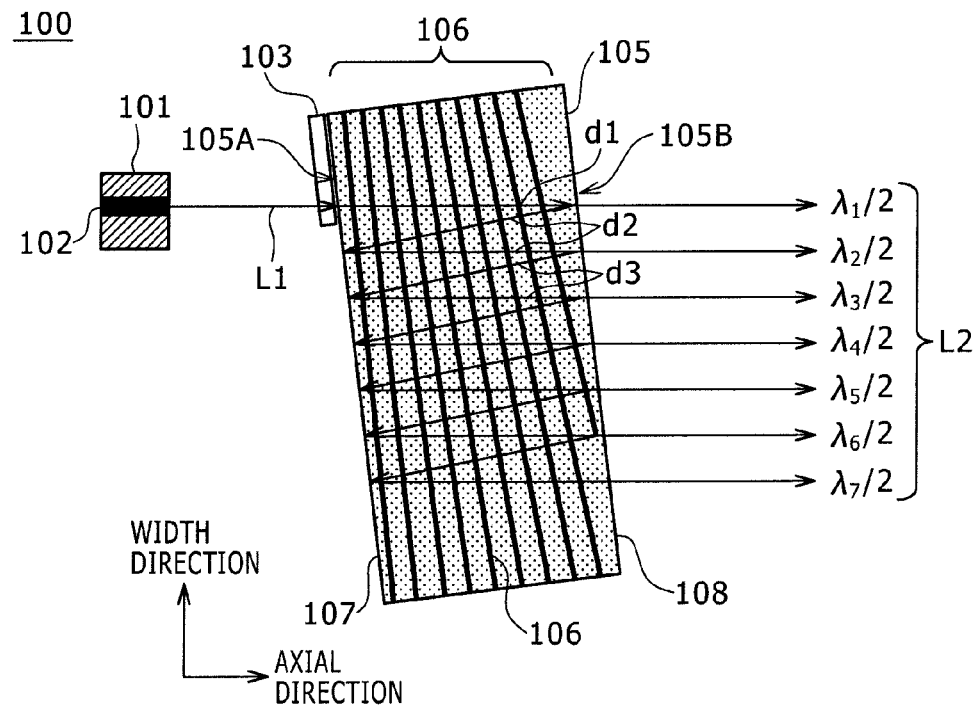

LASER DEVICE, LASER DISPLAY APPARATUS, LASER RADIATING APPARATUS, AND NONLINEAR OPTICAL ELEMENT

The present application claims priority to Japanese Patent Application JP 2009-047028 filed in the Japan Patent Office on Feb. 27, 2009, the entire content of which is hereby incorporated by reference.

BACKGROUND OF THE INVENTION

1. Field of the Invention

The present invention relates to a laser device which wavelength-converts laser beams emitted from either a semiconductor laser having a plurality of luminous points, or a semiconductor having a longitudinal multimode, a laser display apparatus, a laser radiating apparatus, and a nonlinear optical element.

2. Description of the Related Art

A laser light source is useful as a light source for a projection display which has a wide color gamut, high color purity and a high efficiency. Thus, the laser light source can provide an image which is of high quality in terms of a color reproducibility, minute expression, a local luminance and the like. However, since a laser beam emitted from the laser light source is a highly coherent light, when the laser beam is radiated to a surface to be radiated, a speckle noise due to coherency is generated, thereby causing deterioration of the image quality.

With regard to a method of suppressing the speckle noise, heretofore, there have been proposed a method of driving a laser at a high frequency, and a method of vibrating either a diffusion plate or a diffusion sheet. In addition thereto, a method using an external optical element has been proposed. The method is typified by a method of causing a laser beam to pass through each of fibers having different lengths once, thereby reducing coherency. Moreover, there has been proposed a method using a semiconductor laser array for emitting a low-coherence beam in which an oscillation wavelength width is spread up to about 4 nm.

Of these various methods, the method of spreading the wavelength by using the semiconductor laser array has an advantage that the speckle noise can be reduced with an inexpensive device structure because it is not accompanied by an increase in number of members and scale-up of a driving circuit.

Now, with regard to the lasers, a solid-state laser, a liquid laser, a gas laser, a semiconductor laser, a free electron laser, and the like are known depending on media thereof. First of all, the semiconductor laser has the properties, such as a compact size, lightweight, and low power consumption, which are suitable for the laser light source for the display. However, a semiconductor material adapted to emit a laser beam which has a green wavelength band of the three primary colors, red, green and blue, and which is practical enough in terms of the efficiency and the reliability is not yet developed at present.

For this reason, there is mainly used a technique for waveform-converting a laser beam having a wavelength in an infrared wavelength band by using a nonlinear optical element, thereby obtaining a laser beam having a wavelength in a wavelength band of green. For example, a laser beam having a waveform in a 1,060 nm band and emitted from either a semiconductor laser or a Diode Pumped Solid State Laser (DPSSL) is used as a fundamental wave. Also, a green laser beam having a wavelength in a 530 nm band can be obtained by forming a second-order harmonic in a nonlinear optical crystal such as lithium niobate ($LiNbO_3$) or lithium tantalite ($LiTaO_3$). This technique, for example, is described in JP-T-2008-522445 (hereinafter referred to as Patent Document 1).

In addition, a wavelength converting device is proposed in which a periodical modulation structure having a plurality of periods in a traveling direction of a light is provided in a nonlinear optical medium for wavelength-converting excited lights having a plurality of wavelengths and made incident thereto, thereby making it possible to carry out the design corresponding to the arbitrary number of waveforms of the excited lights. This wavelength converting device, for example, is described in Japanese Patent No. 3,971,708 (hereinafter referred to as Patent Document 2).

Moreover, a laser device for wavelength-converting a laser beam having a longitudinal multimode is proposed as a light source for the purpose of reducing the speckle noise described above in the laser device for carrying out the wavelength conversion in such a manner. This laser device, for example, is described in Japanese Patent Laid-Open No. 2007-173769 (hereinafter referred to as Patent Document 3).

SUMMARY OF THE INVENTION

For obtaining the second-order harmonic with the practical conversion efficiency by the technique described in Patent Document 1, the fundamental wave and the second-order harmonic need to be pseudophase-matched with a periodical poling structure in the nonlinear optical crystal. A wavelength width of the fundamental wave meeting the condition of the pseudophase matching with the periodical poling structure having a certain determined period is as relatively small as about 0.1 mm in terms of a crystal length necessary for obtaining an effective wavelength conversion efficiency. For this reason, when a semiconductor laser array, for example, having an oscillation wavelength width which is as relatively wide as about 1 nm within the luminous point and 3 nm within the array is used as a fundamental wave light source for the purpose of reducing the speckle noise described above, the pseudophase matching condition can not be met in all the wavelengths.

Since the wavelength width of the semiconductor laser array is as wide as several nanometers, the semiconductor laser array has the effect of reducing the speckle noise described above. However, when the wavelength width of the laser beam is narrowed in order to enhance the efficiency of conversion to the second-order harmonic, the speckle noise can not be reduced in turn.

In addition, with the technique described in Patent Document 3, the semiconductor laser having the longitudinal multimode, and a plurality of poling structures each corresponding to the fundamental wave are provided, thereby making it possible to widen the wavelength range capable of meeting the pseudophase matching condition. However, the spectrum of the wavelength of the laser beam emitted from the semiconductor laser having the longitudinal multimode widely disperses. Thus, even the peak power of the spectrum dispersed is reduced when the longitudinal multimode is considered with the same power as that of the longitudinal single mode, and is also reduced as a wavelength is located apart from a central wavelength. In addition, the spectrum of the poling structure adapted to the pseudophase matching also widely spreads in correspondence thereto.

Therefore, in this case, the length of the poling structure effective for the individual wavelengths is limited, and as a result, the efficiency becomes very low. Although the efficiency of the wavelength conversion can be generally enhanced by increasing the incident power density, the power densities corresponding to the individual wavelengths are lower in the longitudinal multimode laser than in the longitudinal single mode laser. In addition, in general, the efficiency of the wavelength conversion can be enhanced by lengthening an interaction length, that is, a crystal length. However, when the crystal length is lengthened in order to obtain the high efficiency, a wavelength conversion tolerance for the individual periodical structures is reduced in accordance with waveform conversion characteristics. There is caused the necessity for providing a large number of poling structures having special periods when the reduction of the wavelength conversion tolerance is desired to be compensated for. As a result, the device is scaled up more and more, and thus it becomes difficult to structure the practical laser device. In addition, when the wavelength width of the laser beam is narrowed in order to enhance the efficiency of the conversion to the second-order harmonic, it may also be impossible to reduce the speckle noise similarly to the case of the laser device described in Patent Document 1.

On the other hand, the technique described in Patent Document 2 aims at changing the wavelength of the excited light, and thus does not refer to the means for simultaneously, efficiently generating conversion lights having a plurality of wavelengths. If a plurality of excited lights are made incident to the same portion of the nonlinear optical element having the poling structure corresponding to a plurality of wavelengths for the purpose of reducing the speckle noise, it is estimated that the excited lights having a plurality of wavelengths correlates to one another in that portion to reduce the wavelength conversion efficiency.

As has been described, the conversion efficiency and the speckle noise show a tradeoff relationship, and thus it has been difficult to manufacture the laser which has the high conversion efficiency, the wide wavelength width, and the practical size together. Therefore, it has been difficult to manufacture the laser which has the high efficiency and the wide wavelength width together, and thus is advantageous in reduction of the speckle noise, and which becomes the highly practical laser light source for the display, for example, in the wavelength band of the green light based on the wavelength conversion.

The present embodiment has been made in the light of the problems described above, and it is therefore desirable to provide a laser device in which a wavelength width of a laser beam can be widened while a pseudophase matching condition for a poling structure in a nonlinear optical element is met, a laser display apparatus, a laser radiating apparatus, and a nonlinear optical element.

In order to attain the desire described above, according to an embodiment of the present invention, there is provided a laser device including: a fundamental wave generating portion for generating a plurality of fundamental waves having wavelengths which are different from each other in at least one set thereof, the fundamental wave generating portion having a semiconductor laser having a plurality of luminous points, and a Bragg reflection structure; and a nonlinear optical element in which a poling structure adapted to pseudophase matching for the wavelengths of the plurality of fundamental waves emitted from the fundamental wave generating portion, respectively, is formed variatively along a propagating direction of the plurality of fundamental waves.

According to another embodiment of the present invention, there is provided a laser device including: a semiconductor laser having a longitudinal multimode; and a nonlinear optical element in which different poling structures for converting a fundamental wave having a wavelength width and emitted from the semiconductor laser into harmonics through pseudophase matching are formed along a propagating direction of the fundamental wave.

According to still another embodiment of the present invention, there are provided a laser display apparatus and a laser radiating apparatus respectively including a light source including a laser device.

According to the present embodiment, as has been described, the poling structure adapted to the pseudophase matching for the plurality of fundamental waves having the wavelengths different from one another is provided along the propagating directions of the laser beams in the nonlinear optical element. Therefore, the lights having the respective wavelengths can meet the respective pseudophase matching conditions in respective optical paths within the nonlinear optical element.

As set forth hereinabove, according to the present embodiment, for the semiconductor laser having a plurality of luminous points, the stabilization is carried out for the laser beams having the wavelengths which are different from each other in at least one set thereof in the Bragg reflection structure. For this reason, the wavelength widths of the different wavelengths of the laser beams can be made to fall within a wavelength width capable of meeting the pseudophase matching condition of the pseudophase matching conditions.

In addition, the laser beams having the extended wavelength band is obtained because the stabilized laser beams having the different wavelengths are collectively converted into the respective harmonics by the nonlinear optical element.

Moreover, the laser device includes the nonlinear optical element which has the poling structure corresponding to the fundamental waves having the respective wavelength widths and formed along the propagating directions of the fundamental waves. Also, the light beams can be propagated over a long distance while the pseudophase matching is met over the wide wavelength width by the laser incidence portion which is provided in the nonlinear optical element and which transmits the fundamental waves, and the structure which is provided in the nonlinear optical element, and which has the high reflectivity for the fundamental waves, and has the high transmittance for the harmonics. As a result, the harmonics can be taken out over the wide wavelength width.

BRIEF DESCRIPTION OF THE DRAWINGS

FIG. 14 is a schematic view showing a structure of a laser device according to a sixth embodiment of the present invention;

FIG. 15 is a schematic view showing a structure of a laser device according to a seventh embodiment of the present invention;

DETAILED DESCRIPTION OF THE PREFERRED EMBODIMENTS

The preferred embodiments of the present invention will be described in detail hereinafter with reference to the accompanying drawings. It is noted that the description will be given below in accordance with the following order.

1. First Embodiment (the first case where a poling period and a poling duty ratio changes in a propagating direction).

2. Second Embodiment (the second case where the poling period and the poling duty ratio changes in the propagating direction).

3. Third Embodiment (the case where the poling period changes both in the propagating direction, and in a laser array arrangement direction).

4. Fourth Embodiment (the case either an initial phase of the poling, or the poling duty changes in the propagating direction).

5. Fifth Embodiment (the case where an arrangement of a Bragg reflection structure is changed).

6. Sixth Embodiment (the case where the Bragg reflection structure and a nonlinear optical element are integrated with each other).

7. Seventh Embodiment (the case where a semiconductor laser having a longitudinal multimode is used).

8. Eighth Embodiment (a laser display apparatus).

9. Ninth Embodiment (a laser printer apparatus).

10. Tenth Embodiment (an exposure apparatus).

11. Eleventh Embodiment (a nonlinear optical element).

1. First Embodiment (The First Case where a Poling Period and a Poling Duty Ratio Both Change in a Propagating Direction)

Figure 1:
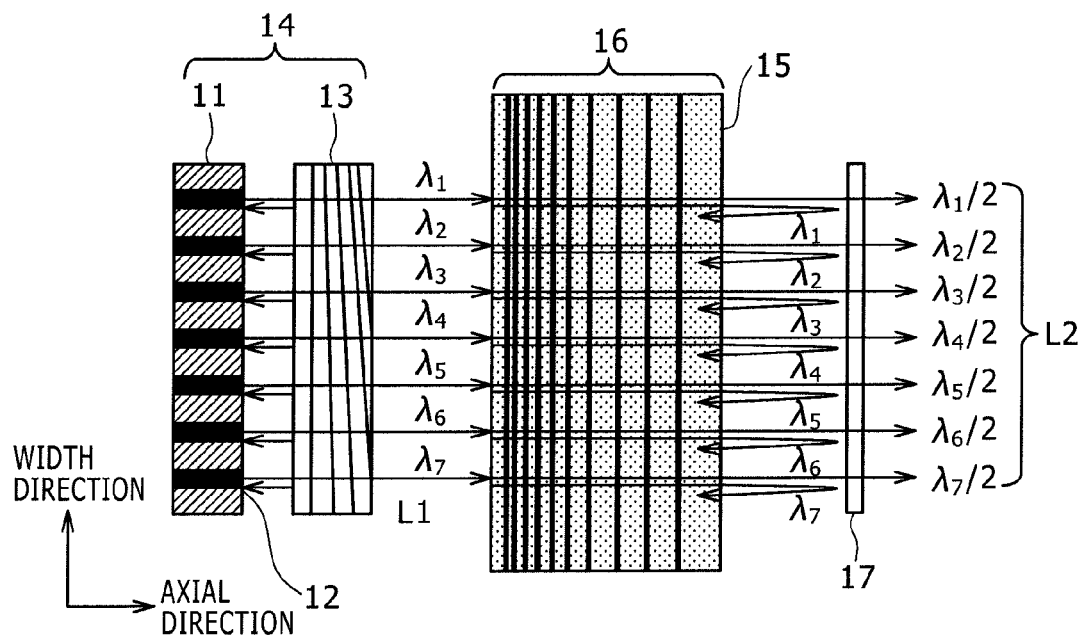
FIG. 1 is a schematic view showing a structure of a laser device according to a first embodiment of the present invention.

FIG. 1 is a schematic view showing a structure of a laser device according to a first embodiment of the present invention. As shown in FIG. 1, the laser device 10 includes a fundamental wave generating portion 14 composed of a semiconductor laser 11 composed of a laser array having a plurality of luminous points 12, and a Bragg reflection structure 13. The fundamental wave generating portion 14 is structured in such a way that a plurality of fundamental waves having respective wavelengths which are different from each other in at least one set thereof are generated. In addition, a nonlinear optical element 15 is disposed in a direction along which a plurality of fundamental waves L1 are emitted from the fundamental wave generating portion 14. A poling structure 16 adapted to pseudophase matching for the wavelengths of the fundamental waves L1 is formed along respective propagating directions of a plurality of fundamental waves L1 in the respective propagating directions of a plurality of fundamental waves L1 within the nonlinear optical element 15. A plurality of fundamental waves L1 emitted from the fundamental wave generating portion 14 are converted into harmonics, for example, second-order harmonics through the pseudophase matching by the poling structure 16.

In the first embodiment, a semiconductor laser array is used as the semiconductor laser 11 having a plurality of luminous points 12. In this case, the semiconductor laser array has seven luminous points 12 arranged in a linear fashion, and emits seven laser beams having different central wavelengths $\lambda 1$ to $\lambda 7$. It is noted that the number of luminous points 12, and the number of different central wavelengths are by no means limited thereto. For realizing a light source, for a display, having a low speckle noise, it is better that a wavelength difference between each two laser beams of the laser beams emitted from the respective luminous points 12 is large as much as possible. However, when the wavelength difference is made too large, a color reproducibility is reduced, and when the laser beam having the wavelength which is largely deviated from a center of a gain frequency band of the semiconductor laser 11 is emitted, an electrooptic conversion efficiency is reduced. For this reason, a difference between the shortest wavelength and the largest wavelength within the semiconductor laser array, for example, is preferably set in the range of 4 to 6 nm. The reason for this is because when the difference between the shortest wavelength and the largest wavelength within the semiconductor laser array is smaller than 4 nm, the effect of reducing the speckle noise is not sufficiently obtained, and when the difference between the shortest wavelength and the largest wavelength exceed 6 nm, the color reproducibility and the electrooptic conversion efficiency are both reduced.

In this way, the laser beams (the fundamental waves L1 having the central wavelengths λ1 to λ7 shown in FIG. 1, for example, having the wavelength difference in the range of 4 to 6 nm as a whole are made incident to the Bragg reflection structure 13 to be stabilized into lights each having a wavelength width of about 0.1 nm. The following two structures are mainly given as the general Bragg reflection structure. One of the two structures is a Distributed Feed Back (DFB) structure which is formed inside a light generating region within the semiconductor laser. The other is a Distributed Bragg Reflector (DBR) structure which is formed outside the light generating region within the semiconductor laser. In addition thereto, there are an External Grating (EG) structure in which a diffraction grating such as a Volume Bragg Grating (VBG) is installed outside the semiconductor laser, and the like. In the present embodiment, any of these structures may be used. In the first embodiment of the present invention, there is shown the case where the EG structure in which the VBG is installed outside the semiconductor laser is adopted as the Bragg reflection structure 13. In the Bragg reflection structure 13, a period of repetition of a high-refractive index material and a low-refractive index changes in a direction of arrangement of the luminous points 12 of the semiconductor laser array 11, and a reflection wavelength thereof changes in the direction of arrangement of the luminous points 12, that is, in the element width direction. The Bragg reflection structure 13 and the semiconductor laser 11 compose a resonator. Thus, the laser beams having the respective wavelengths which change in the element width direction are Bragg-reflected by the Bragg reflection structure 13 to be fed back to the luminous points 12 of the semiconductor laser 11, respectively. Also, the reflected laser beams having the respective waveforms resonate between the semiconductor laser 11 and the Bragg reflection structure 13 to be locked between them.

When only the semiconductor laser array serving as the longitudinal multimode light source not locking the wavelengths is used as the light source, the efficiency can not be sufficiently obtained because the wavelength(s) not converted in the nonlinear optical element exists(exist). However, in the first embodiment, it is possible to reduce the wastefulness of the laser beams emitted from the semiconductor laser 11 because the laser beams are stabilized in advance so as to have the wavelengths which can be converted in the nonlinear optical element in such a manner. Also, it is possible to avoid the reduction of the efficiency following the reduction of the interaction length for the individual wavelengths, which results from that all the laser beams emitted from the longitudinal multimode light source are intended to be converted in the nonlinear optical element 15.

The laser beams the wavelength widths of which are adjusted in such a manner are made incident to the nonlinear optical element 15 to be converted in wavelengths thereof.

The nonlinear optical element 15 is used in the wavelength conversion such as the second-order harmonic generation (SHG), or used as the wavelength conversion between the fundamental wave and the second-order harmonic generated in the third-order harmonic generation (THG), or used in sum wavelength generation, optical parametric oscillation or the like. The laser beams having wavelengths different therefrom and emitted from another light source may be made incident to the nonlinear optical element 15 hereby realizing the various waveform conversions described above. A material capable of carrying out the poling is selected as the material used, and $KTiOPO_4$, $RbTiOPO_4$, $LiTaO_3$, $LiNbO_3$ or the like is given as an example thereof. In addition, a congruent composition thereof, a stoichiometric composition thereof, or a material to which an additive such as MgO or ZnO is added is given as an example of that material used.

For example, it is possible to utilize a crystal element made of PP—C—$LiNbO_3$, PP—C—$LiTaO_3$, PP—S—$LiNbO_3$ (PPSLN), PP—S—$LiTaO_3$ (PPSLT), PP—MgO:C—$LiNbO_3$ or the like. In addition, it is also possible to utilize a crystal element made of PP—MgO:C—$LiTaO_3$, PP—ZnO:C—$LiNbO_3$, PP—ZnO:C—$LiTaO_3$, PP—MgO:S—$LiNbO_3$ or the like. Moreover, it is also possible to utilize a crystal element made of PP—MgO:S—$LiTaO_3$, PP—ZnO:S—$LiNbO_3$, PP—ZnO:S—$LiTaO_3$, PP—$KTiOPO_4$ or the like. Here, it is noted that "C" means "a Congruent composition," "S" means "a Stoichiometric composition," and "PP" means "Periodical Poling."

In general, the nonlinear optical crystal having the periodical poling structure has large nonlinear optical constants and thus obtains the high conversion efficiency as compared with the case of the existing nonlinear optical crystal. In addition, since the nonlinear optical crystal having the periodical poling structure can be mass-produced by utilizing the wafer process technique, it is advantageous in reduction of the cost. In particular, periodical poling lithium tantalite (PPSLT) having a stoichiometric composition obtained through Vapor Transport Equilibration (VTE) processing or the like is suitable as a nonlinear optical material forming the periodical poling structure. The reason for this is because when the PPSLT is used, the photorefractive resistance is improved as compared with the case of the congruent composition. For this reason, since the PPSLT is superior in long-term reliability and thus the device having the high conversion efficiency is obtained, the high output light (the second-order harmonic light or the like) of several watt or more can be stably obtained.

Figure 2:
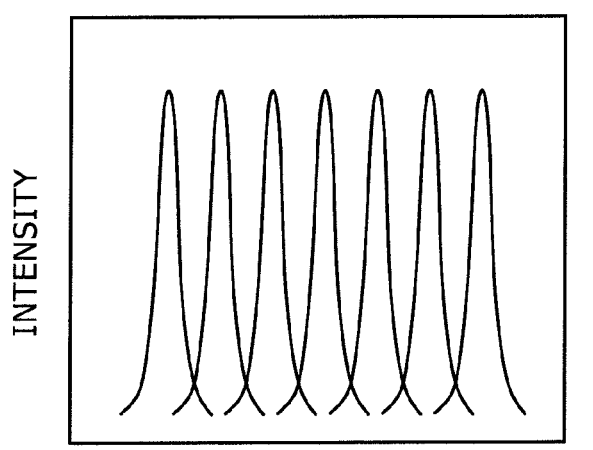
FIG. 2 is a graphical representation showing intensities of wavelength lights emitted from the laser device according to the first embodiment of the present invention.

Also, the nonlinear optical element 15 in the first embodiment is structured in such a way that the poling period thereof changes in the propagating direction of the light (fundamental wave). In addition, in the first embodiment shown in FIG. 1, there is shown the case where since the period changes while the width itself of the poling is held constant, the duty ratio of the poling also changes along with the change of the period. For this reason, the period and the duty ratio of the poling change on the optical paths of the laser beams having the central wavelengths λ1 to λ7. It is noted that the change is largely exaggerated in FIG. 1, and thus in the case of the wavelength range of several nanometers, all it takes is that the period and the poling duty are changed so as to correspond to the wavelength change. The change amounts of periods and duty ratios are designed so as to meet the pseudophase matching condition for the wavelengths of all the incident laser beams having the wavelengths λ1 to λ7. Therefore, the periods and the duty ratios meeting the pseudophase matching condition for the light beams having a plurality of wavelengths, respectively, are partially formed within the respective optical paths. In other words, the poling structure 16 adapted to the pseudophase matching for the light beams having a plurality of wavelengths, respectively, can be disposed within one nonlinear optical element 15. As a result, the incident laser beams can be collectively converted into the second-order harmonics L2, respectively. It is noted that although in the first embodiment, there is shown the case where both the period and the duty ratio of the poling change, when the desired pseudophase matching condition is obtained, the structure may be adopted such that either only the period or only the duty ratio changes. In general, the duty ratio for obtaining the optical conversion efficiency becomes approximately a constant value such as 1:1 in the case of, for example, the first-order pseudophase matching. However, when the conversion spectrum is changed, that case does not apply to this case. Also, only the second-order harmonics L2 obtained through the conversion in the nonlinear optical element 15 are transmitted through a filter 17 to be emitted to the outside. As a result, a laser light source for emitting laser beams having a wavelength width of 2 to 3 nm is obtained. It should be noted that the filter 17 has a function of being capable of separating the residual fundamental wave left after completion of the wavelength conversion from the second-order harmonic as may be necessary, for example, absorbing the residual fundamental wave, or changing the beam propagating direction to another direction in addition to reflection of the residual fundamental wave. FIG. 2 is a graphical representation showing spectra of the laser beams having respective desired wavelength widths and obtained from the laser device 10 shown in FIG. 1. In this case, there are obtained the second-order harmonics having the spectra having the central wavelength of $\lambda 1/2, \lambda 2/2, \ldots, \lambda 7/2$. By using the laser device 10 as a light source for a display, the speckle noise is reduced, and a high-image quality and high-quality image is obtained.

It is noted that in the first embodiment, the structure is adopted such that as described above, in the nonlinear optical element 15, the pseudophase matching condition changes in the propagating direction of the fundamental waves. For this reason, the optical position adjustment about the element width direction (the arrangement direction of the luminous points 12 of the semiconductor laser array 11) becomes unnecessary as compared with the case where the nonlinear optical element is used in which the pseudophase matching condition changes in the element width direction. Since all it takes is that only the position adjustment about the propagating direction of the fundamental waves (about the direction of optical axes of the light beams) is carried out, the work for assembly and adjustment of the laser device 10 is dramatically simplified.

Figure 19:
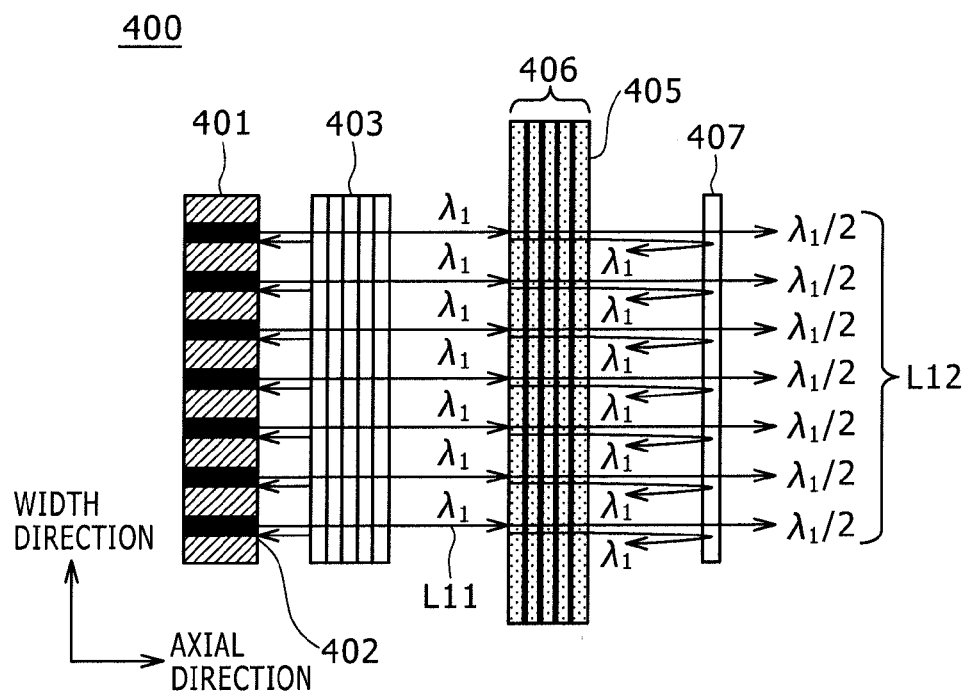
FIG. 19 is a schematic view showing a structure of a laser device according to a comparative example.

On the other hand, for example, when a period of a nonlinear optical element is constant as with a laser device according to a comparative example shown in FIG. 19, a wavelength of the laser beam emitted has a wavelength width which is as narrow as about 0.1 nm meeting the pseudophase matching condition of the period concerned. For this reason, the speckle noise can not be reduced.

A laser device 400 shown in FIG. 19 has a semiconductor laser array 401 and a Bragg reflection structure 403. In this case, the semiconductor laser array 401 emits fundamental waves L11 of the laser beams. The Bragg reflection structure 403 stabilizes wavelengths of the fundamental waves emitted from respective luminous points 402 of the semiconductor laser array 401. In addition, the laser device 403 is structured so as to have a nonlinear optical element 405 having a periodical poling structure 406, and a filter 407.

The luminous points 402 are arranged in a linear fashion in the semiconductor laser array 401. Thus, a semiconductor laser, a diode pumped solid state laser (DPSSL) or the like having a wavelength of 1,060 nm band is used in the semiconductor laser array 401.

The Bragg reflection structure 403 has a structure such that a low-refractive index material and a high-refractive index material are laminated in a traveling direction of the light beams. Thus, the Bragg reflection structure 403 is structured so as to have a high reflectivity against a corresponding specific wavelength in an area having a certain specific period. In addition, a ferroelectric crystal such as lithium niobate ($LiNbO_3$) or lithium tantalite ($LiTaO_3$) is used as a material for the nonlinear optical element 405. Thus, the nonlinear optical element 405 adopts a structure such that inversion and noninversion of the polarization direction are repeated with a predetermined period. The converted waves such as the second-order harmonics are generated when the poling period and the wavelengths of the laser beams passing through the nonlinear optical element 405 meet the pseudophase matching condition.

Figure 20:
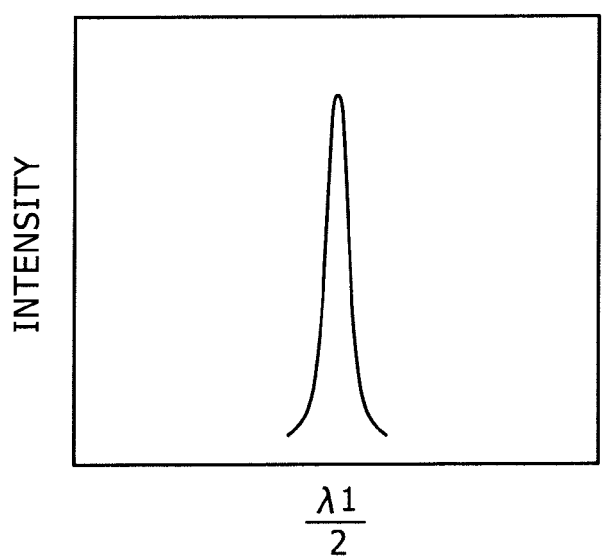
FIG. 20 is a graphical representation explaining an intensity of a laser beam emitted from the laser device shown in FIG. 19.

In this comparative example, the laser beams emitted from the semiconductor laser array 401 are stabilized into fundamental waves L11 each having only a wavelength $\lambda 1$ by the Bragg reflection structure 403 described above, and are then made incident to the nonlinear optical element 405. In addition, the poling period of the nonlinear optical element 405 is set so as to meet the pseudophase matching condition for the laser beams each having the wavelength $\lambda 1$ in the entire region within the nonlinear optical element 405. Also, the laser beams each having the wavelength $\lambda 1$ and made incident to the nonlinear optical element 405 are converted into the second-order harmonics L12 each having only a wavelength $\lambda 1/2$. Also, only the second-order harmonics are taken out by the filter 407, and any of the wavelength lights other than the second-order harmonics L12 is reflected by the filter 407. Therefore, when each of the laser beams emitted from the semiconductor laser array 401 has the wavelength of $\lambda 1=1,060$ nm band, as schematically shown in the form of a spectrum in FIG. 20, the green laser beams each having the wavelength $\lambda 1/2$, that is, 530 nm are obtained. Although the high conversion efficiency is obtained when only the conversion for the single wavelength is carried out in such a manner, the generation of the speckle noise becomes a problem when the laser device 400 is used as a light source of a display device.

As an example, a description will be given below with respect to the case where the laser device 10 according to the first embodiment described above adopts a structure such that the green laser beams each having the wavelength of 530 nm and the wavelength width of 3 nm are emitted.

In this case, a laser array composed of a strained InGaAs active layer, for example, having an oscillation wavelength of 1,060 nm is used in the semiconductor laser 11. With regard to the number and disposition of the luminous points 12, for example, the 19 luminous points 12 are arranged at 0.5 mm intervals, and thus can be structured so as to have a width of about 10 mm as a whole.

The Bragg reflection structure 13 composed of the VBG, for example, is made of a glass. Thus, a periodical refractive index change is made in the arrangement direction of the semiconductor laser 11 owing to the photorefractive index effect caused by interference exposure or the like using an ultraviolet laser. By adopting the periodical refractive index change structure in such a manner, a structure is obtained such that the light beam having the specific wavelength within the 1,060 nm band is strongly reflected by the Bragg reflection. The reflection wavelength differs along the arrangement direction of the semiconductor laser array due to the periodical change and the change in duty ratio. Therefore, the laser beams emitted from the 19 luminous points described above, for example, are stabilized so as to have the different wavelengths, in the range of 1,057 to 1,063 nm, each having a wavelength width of 0.1 nm.

A nonlinear optical element which is made of a nonlinear optical crystal such as $LiTaO_3$ and a width of 15 mm is used as the nonlinear optical element 15. The periodical poling structure 16 is formed in the nonlinear optical element 15 by application of a suitable high voltage, and a period thereof, for example, changes in the range of 7.918 to 8.010 μm along the propagating direction of the light beams. The nonlinear optical element 15 generates the laser beams having the wavelengths in the range of 528.5 to 531.5 nm as the second-order harmonics so as to meet the pseudophase matching condition in the range of that period. That is to say, in this case, the harmonics each having the wavelength width of 3 nm are obtained.

In this way, in the first embodiment, during the propagation of a plurality of light beams emitted from the semiconductor laser 11 through the nonlinear optical element 15, the pseudophase matching condition is necessarily met in at least partial region along the propagating direction. Also, in the case where such a structure is adopted, even when there is a manufacture error in the structure of the components or parts composing the fundamental wave generating portion 14, position adjustment or the like for the components or parts composing the fundamental wave generating portion 14 with the nonlinear optical element 15, it becomes possible to reliably generate the second-order harmonics each having the wide wavelength width. That is to say, although the laser device 10 has the simple structure, the laser device 10 has the advantage that when, for example, the positions of the fundamental wave generating portion 14 and the nonlinear optical element 15 are shifted in the element width direction as previously stated, the pseudophase matching condition is necessarily met for any of the fundamental waves L1. As a result, the highly precise optical adjustment in the element width direction in the phase of the assembly becomes unnecessary, which results in the reduction in cost. In addition, since the individual laser beams are wavelength-converted in the different propagation paths of the nonlinear optical element 15, respectively, the spectra have the independence, that is, there is no generation of the second-order harmonics, or no interference or canceling in the phase of the propagation of the second-order harmonics L2. As a result, the spectrum density (the peak power in the spectrum area) is higher in the laser light source 10 than in the longitudinal multimode laser, and thus the high conversion efficiency can be expected.

When such a laser light source 10, for example, is used as the green laser light source, thereby composing the laser light source such as the red and blue semiconductor lasers, and an image forming apparatus such as a laser display apparatus or a laser printer apparatus, the cost can be reduced because it is easy to manufacture the laser light source 10. In addition, the wavelength width in at least one laser light source can be made as wide as 3 nm as compared with the case of the existing laser light source. Therefore, the speckle noise due to the interference is largely reduced, thereby making it possible to display the clearer image.

It should be noted that it is possible to add various kinds of optical elements in such a way that divergence angles from the emitters are suppressed before incidence of the laser beams to the nonlinear optical element 15, thereby preventing the quantities of incident lights to the nonlinear optical element from being reduced, and the incident light beams are condensed onto the nonlinear optical element 15. For example, preferably, cylindrical lenses having powers in a vertical direction to the respective emitters are inserted, and a microlens array corresponding to the emitters is used. When these elements are inserted, it is possible to further increase the power density in the nonlinear optical element 15 and thus it is possible to further enhance the wavelength conversion efficiency.

2. Second Embodiment (The Second Case where the Poling Period and the Poling Duty Ratio Change in the Propagating Direction)

Figure 3:
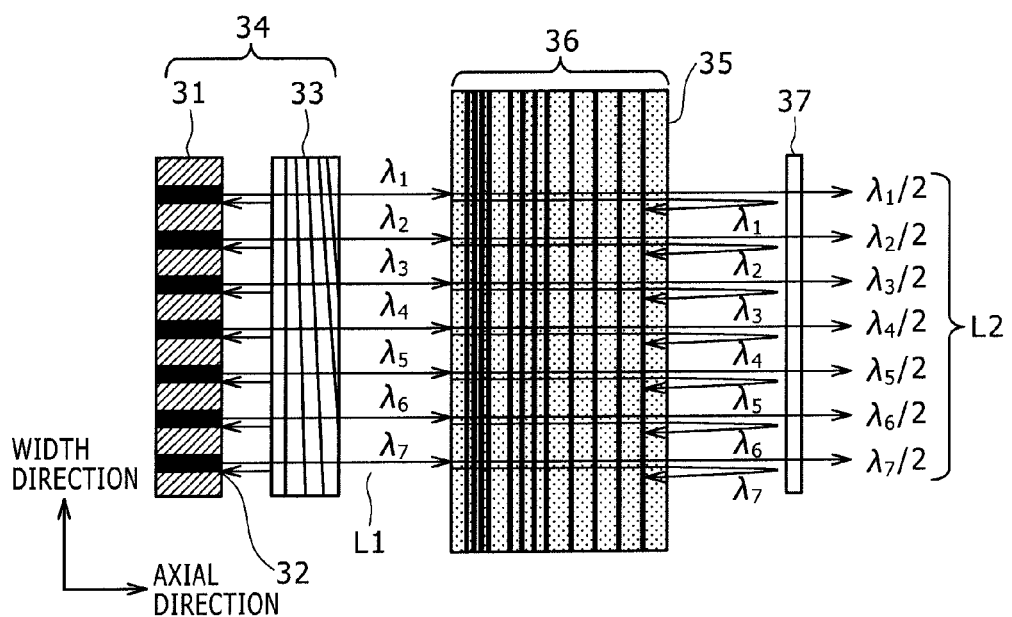
FIG. 3 is a schematic view showing a structure of a laser device according to a second embodiment of the present invention.

FIG. 3 is a schematic view showing a structure of a laser light source device 30 according to a second embodiment of the present invention.

In the laser device 30, a fundamental wave generating portion 34 is composed of a semiconductor laser 31 composed of a semiconductor laser array or the like and having a plurality of luminous points 32, and a Bragg reflection structure 33. Also, the fundamental wave generating portion 34 generates a plurality of fundamental waves L1 having respective wavelengths $\lambda 1, \lambda 2, \ldots \lambda 7$ which are different from each other in at least one set thereof. In addition, a nonlinear optical element 35 having a poling structure 36, and a filter 37 for transmitting the harmonics and reflecting the fundamental waves are disposed in a traveling direction of the fundamental waves L1 generated.

The nonlinear optical element 35 in the second embodiment has regions in which the respective poling periods are constant, and the period changes every region. The wavelength light beams corresponding to the changing periods are converted into the second-order harmonics, respectively. In this case, however, since the propagation length (interaction length) of the region having the constant period can be lengthwise ensured as compared with the case of the first embodiment, the conversion efficiency can be enhanced while the wide wavelength width is held as a whole.

By the way, for meeting the pseudophase matching condition, and thus efficiently carrying out the wavelength conversion into the second-order harmonics L2 or the like, the central wavelengths of the laser beams made incident to the nonlinear optical element 15 need to be justified with the precision of the wavelength width or less at the same time that the wavelength width of these laser beams need to be justified to the narrow width of about 0.1 nm.

In general, since the pseudophase matching condition for the central wavelengths of the fundamental waves, and the periodical poling changes due to the manufacture error, heretofore, the temperature control for the nonlinear optical element is carried out and the incidence angles of the fundamental waves are slightly adjusted, thereby justifying the wavelengths of both the fundamental waves and the harmonics.

Figure 4:
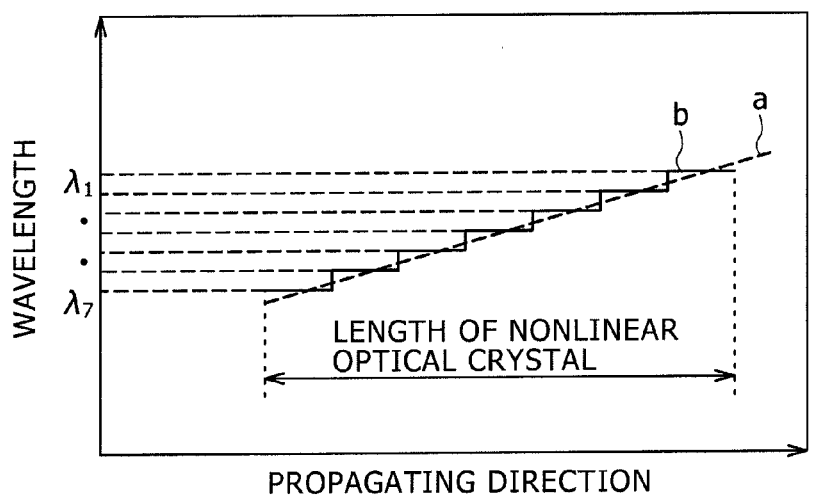
FIG. 4 is a graphical representation expressing a relationship between a position in a propagating direction and a wavelength meeting pseudophase matching within a nonlinear optical element provided in a any of the first and second embodiments of the present invention.

On the other hand, in the second embodiment of the present invention, the structure having the poling periods meeting the different phase matching condition is provided in the optical path direction (propagating direction) of the nonlinear optical element 35. FIG. 4 shows a relationship between a position in the propagating direction, of the laser beams, meeting the phase matching condition in the nonlinear optical element 35, and the wavelength of the laser beam. In FIG. 4, a broken line a indicates the case of the nonlinear optical element 15 in the first embodiment shown in FIG. 1, and a solid line b indicates the case of the nonlinear optical element 35 in the second embodiment. Although in the case of the first embodiment, the broken line a is expressed in a linear fashion because the poling period in the nonlinear optical element 15 approximately continuously changes, the present invention is by no means limited thereto. For example, a curved line may also be taken. On the other hand, in the second embodiment, the wavelength of the laser beams changes in a stepped-like fashion as indicated by the solid line b because the poling period changes every region.

In the present embodiment, it is preferable that as shown in FIG. 4, the period, and the poling duty and a change amount thereof are determined so that the wavelength band with which the fundamental waves L1 can be wavelength-converted into the second-order harmonics L2 or the like by the poling structure 36 as with contains therein the entire wavelength band of the fundamental waves L1 in the semiconductor laser 31. As a result, the fundamental waves L1 having the different wavelengths $\lambda 1, \lambda 2, \ldots, \lambda 7$ and emitted from the respective luminous points 32 necessarily reach the regions having the respective poling periods each meeting the pseudophase matching condition, and the respective poling duties during the propagation through the nonlinear optical element 35. For this reason, the desired wavelength conversion can be carried out irrespective of the manufacture error (the dispersion or the like of the center intervals, the wavelength intervals, and the luminous point positions). Therefore, the reduction of the yield of the laser devices can be suppressed, thereby making it possible to enhance the productivity.

Figure 5A:
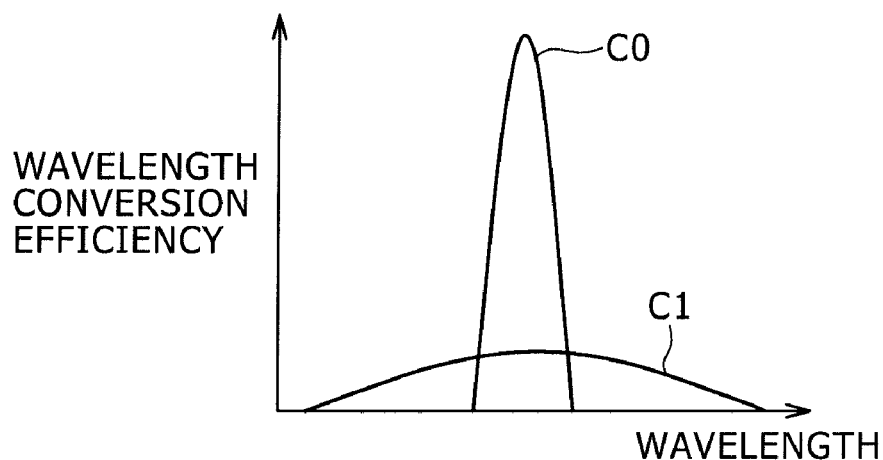
FIGS. 5A, 5B and 5C are respectively a graphical representation showing a spectrum of a wavelength conversion efficiency, a schematic view showing a structure of a nonlinear optical element having a uniform poling structure in a propagating direction, and a conceptual view showing a structure of a nonlinear optical element having a poling structure changing in the propagating direction.
Figure 5B:
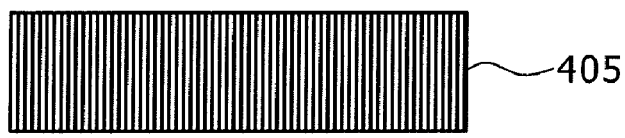
Figure 5C:
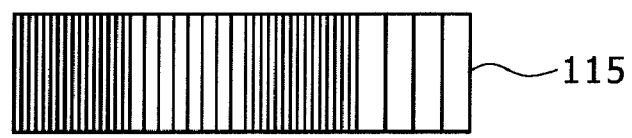

FIG. 5A shows a schematic graphical representation comparing the wavelength conversion efficiency in the case where the nonlinear optical element 15 or 35 in the first or second embodiment is used with the wavelength conversion efficiency in the case where the existing nonlinear optical element having the poling structure having the constant period is used. A solid line C0 in FIG. 5A shows the wavelength conversion efficiency plotted against the wavelength in the case where as schematically shown in FIG. 5B, a nonlinear optical element 405 having a constant period in a poling structure is used. On the other hand, a solid line C1 in FIG. 5A shows the wavelength conversion efficiency plotted against the wavelength in the case where as schematically shown in FIG. 5C, a nonlinear optical element 115 having a poling structure in which, for example, a period changes in the propagating direction. In this case, the wavelength conversion efficiency means a conversion efficiency when the incidence powers in the respective wavelengths are identical to one another. As can be seen from FIGS. 5A to 5C, in the case of the nonlinear optical element 405 having the poling structure having the constant period, although the maximum conversion efficiency is high, the wavelength band in which the conversion efficiency can be obtained is narrow. On the other hand, in the case where the poling structure having the different periods is provided within the nonlinear optical element 115, the waveform conversion can be carried out over the wide wavelength band. In addition, as the poling structure having the period changing in the propagating direction, and corresponding to the wider wavelength region is provided in the nonlinear optical element, the waveform conversion can be carried out over the wide wavelength band although the wavelength conversion efficiency is reduced.

Figure 6A:
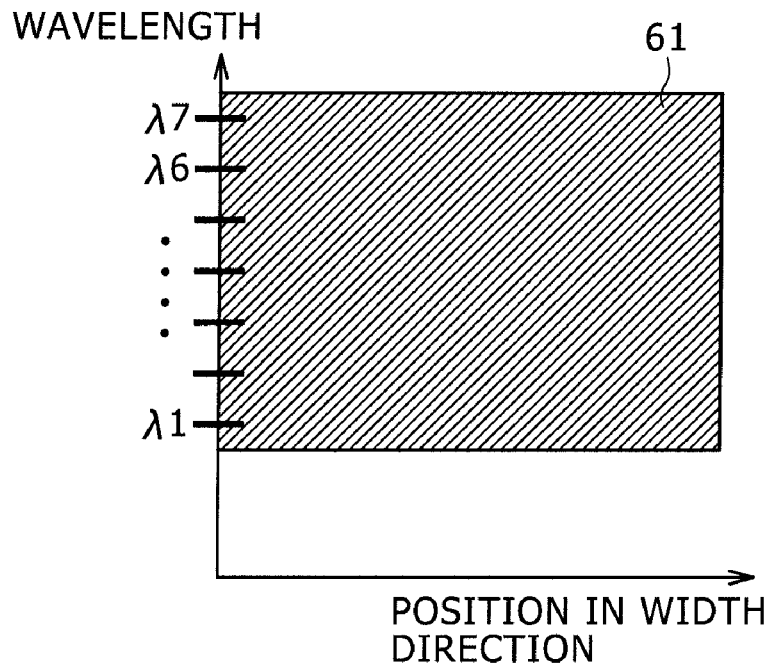
FIGS. 6A and 6B are respectively a graphical representation showing an area in which wavelength-conversion can be carried out in the laser device according to any of the first and second embodiments of the present invention, and a graphical representation showing a spectrum of a wavelength conversion efficiency.

In the first and second embodiments of the present invention described above, the region adapted to the phase matching for the respective wavelengths are provided along the propagating direction of the fundamental waves. A waveform-convertible area, in the nonlinear optical element, defined between the width direction (the arrangement direction of the semiconductor laser array) and the wavelengths of the light beams is schematically as shown in FIG. 6A. In FIG. 6A, in this case, an axis of ordinate represents the wavelength. Also, the central wavelengths λ1, λ2, . . . , λ7 of the fundamental waves L1 in the first or second embodiment shown in FIG. 1 or FIG. 3, respectively, are schematically shown in the form of black lines, respectively, on the axis of ordinate. As apparent from FIG. 6A, a wavelength convertible area 61 exist within the nonlinear optical element over the entire area in the width direction.

Figure 6B:
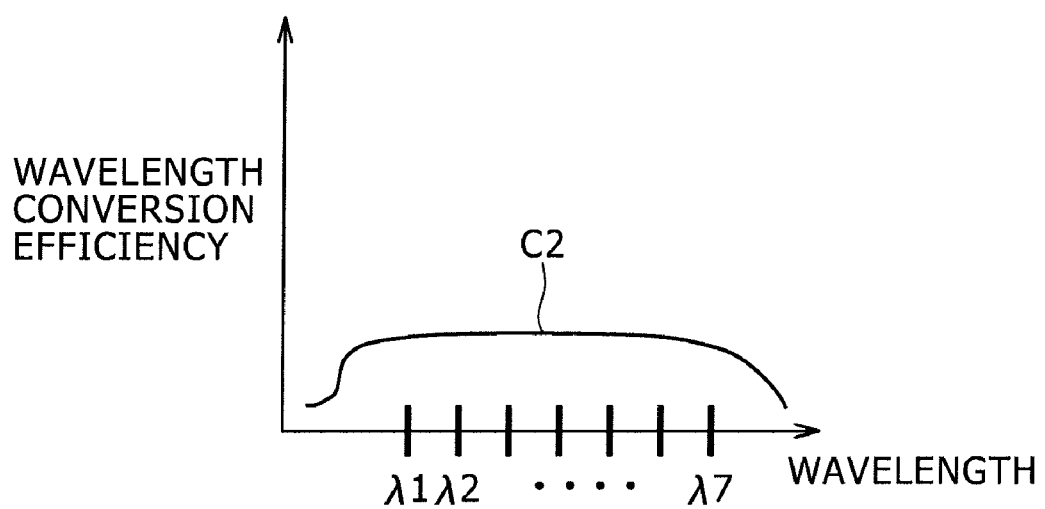

FIG. 6B shows a relationship between the wavelength and the conversion efficiency (the spectrum of the wavelength conversion efficiency) in this case. As can be seen from FIG. 6B, nearly the same conversion efficiency is obtained over all the central wavelengths λ1, λ2, . . . , λ7 of the fundamental waves L1. As has been described, according to the first or second embodiment of the present invention, it is understood that for the fundamental waves having the predetermined wavelength band, the conversion efficiency is obtained over the entire wavelength band. In addition, as can be seen from FIG. 6A, it is understood that a margin for the position shift in the width direction can be ensured, and thus the optical position adjustment for the semiconductor laser and the nonlinear optical element is very simplified.

In addition, a ripple appears in the wavelength conversion spectrum obtained from the poling structure having the gradually changing period or a plurality of constant periods as described above in some cases. In such cases, the phase of the modulation in the periodical structure is shifted (a portion having a length different from the period is inserted between each adjacent two regions, and so forth), or the duty ratio of the poling changes, thereby making it possible to adjust the conversion efficiency for the individual wavelengths by increasing or decreasing the conversion efficiency. For this reason, it is possible to obtain the smooth wavelength conversion spectrum.

As a result, since it is possible to suppress the spectrum dispersion of the output light beams, it is possible to provide the laser device in which the color adjustment is readily carried out.

It is noted that although the first and second embodiments of the present invention described above show the case where the period of poling structure gradually increase in the propagating direction, the form of the change of the period or the like needs not be uniform. That is to say, the present invention is by no means limited to the case where the period or the like gradually increases or gradually decreases, and thus the disposition of the magnitude relation of the period may change back and forth. When the regions which are different in phase matching condition from one another are disposed back and forth, the conversion efficiency can also be changed in accordance with the phase relationship between the fundamental waves and the light beams obtained through the wavelength conversion (the pseudophase matching condition changes as a whole). Therefore, all it takes is to suitably select the disposition position of the poling structure in which the period or the like is made to differ so that the high conversion efficiency is obtained and the speckle noise is sufficiently reduced.

3. Third Embodiment (The Case where the Poling Period Changes in the Propagating Direction and in the Laser Array Arrangement Direction)

Figure 7:
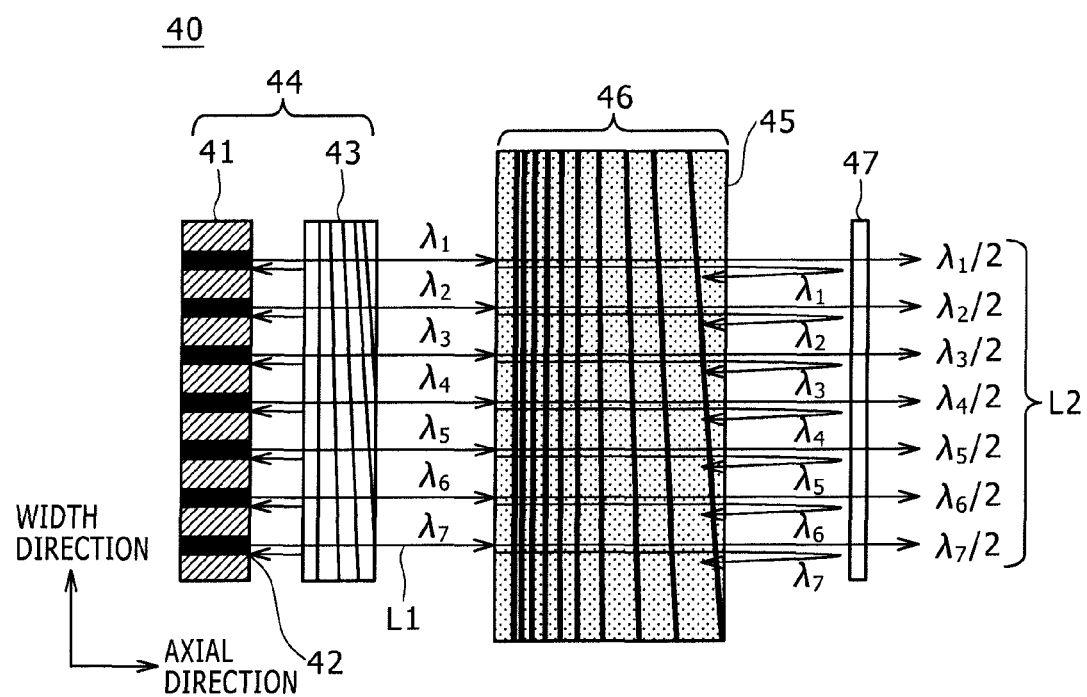
FIG. 7 is a schematic view showing a structure of a laser device according to a third embodiment of the present invention.

FIG. 7 is a schematic view showing a structure of a laser device 40 according to a third embodiment of the present invention.

The laser device 40 includes a fundamental wave generating portion 44 composed of a semiconductor laser array 41 and a Bragg reflection structure 43. In this case, the semiconductor laser array 41 has a plurality of luminous points 42. Also, the Bragg reflection structure 43 stabilizes the laser beams emitted from the semiconductor laser array 41 into a plurality of fundamental waves L1 having respective wavelengths λ1, λ2, . . . , λ7 which are different from each other in at least one set thereof. In addition, the laser device 40 includes a nonlinear optical element 45 and a filter 47. In this case, the nonlinear optical element 45 has a poling structure 46 meeting the pseudophase matching condition for a plurality of fundamental waves L1 generated in the fundamental wave generating portion 44. Also, the filter 47 transmits the second-order harmonics L2 and the like, and reflects the fundamental waves L1.

The nonlinear optical element 45 in the third embodiment is structured in such a way that the period and the duty ratio of the poling structure 46 not only change in the propagating direction of the light beams, but also gradually change in the element width direction as well so as to correspond to the wavelengths stabilized by the Bragg reflection structure 43.

Figure 8A:
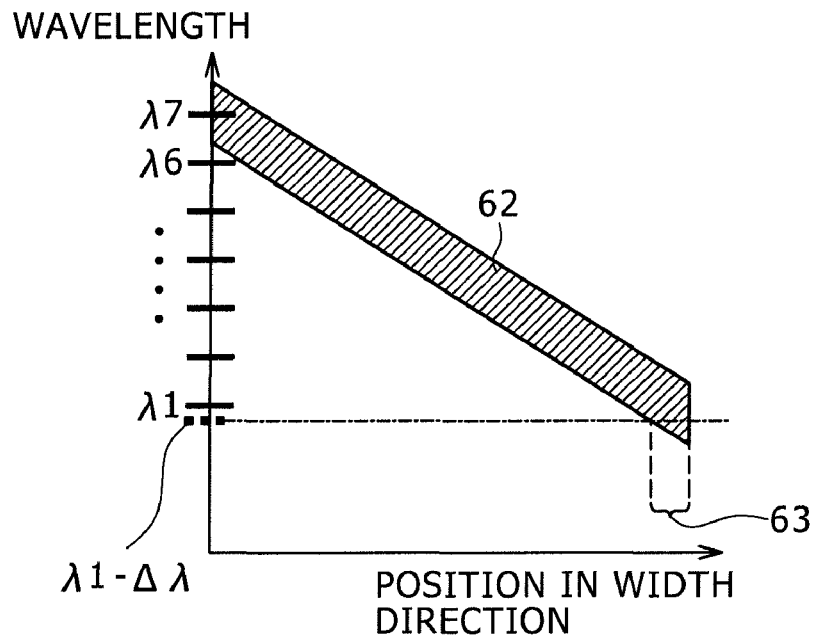
FIGS. 8A and 8B are respectively a graphical representation showing an area in which wavelength-conversion can be carried out in the laser device according to the third embodiment of the present invention, and a graphical representation showing spectra of wavelength conversion efficiencies.

A distribution of a wavelength convertible area defined between the position in the width direction and the wavelengths of the respective fundamental waves in this case is schematically shown in FIG. 8A. In FIG. 8A, portions corresponding to those in FIG. 6A are designated by the same reference symbols, respectively, and a repeated description thereof is omitted here for the sake of simplicity. As can be seen from FIG. 8A, a waveform convertible area 62 for the light beams having the central wavelengths $\lambda 1, \lambda 2, \ldots, \lambda 7$ of the respective fundamental waves L1 is provided a predetermined area by a predetermined area in the width direction of the nonlinear optical element 45. At this time, it is understood that even when the central wavelength, for example, is shifted from the central wavelength $\lambda 1$ to $\lambda 1 - \Delta\lambda$) due to the change or the like of the characteristics of the semiconductor laser 41, a wavelength convertible area 63 corresponding to this shift exists.

Figure 8B:
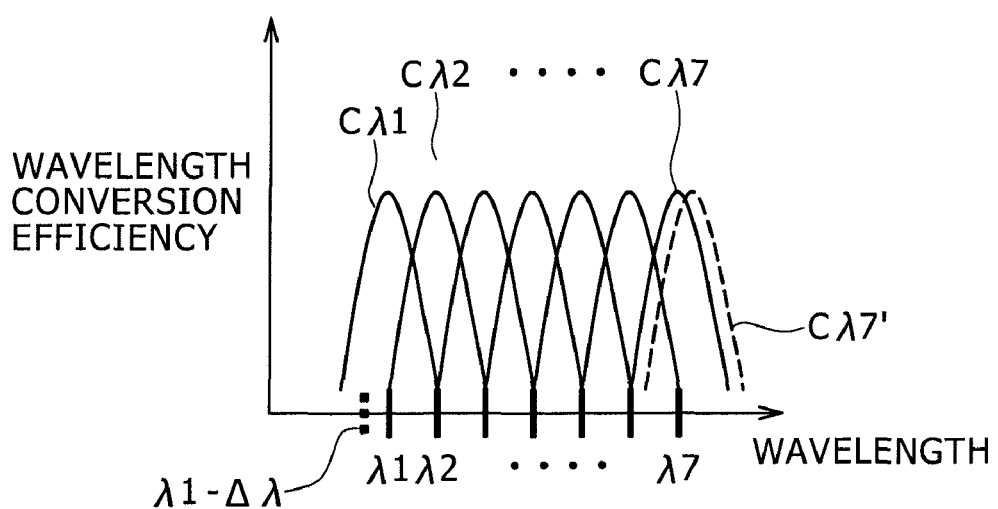

In addition, FIG. 8B shows spectra of the wavelength conversion efficiencies at this time. In FIG. 8B, $C\lambda 1, C\lambda 2, \ldots, C\lambda 7$ indicated by respective solid lines show the waveform conversion efficiencies of the light beams having the central wavelengths $\lambda 1, \lambda 2, \ldots, \lambda 7$, respectively. Also, $C\lambda 7'$ indicated by a broken line shows the waveform conversion efficiency when the width position of the light beam having the central wavelength $\lambda 7$ is shifted. In the case shown in FIG. 8B, the relatively high wavelength conversion efficiencies are obtained for the light beams having the respective central wavelengths $\lambda 1, \lambda 2, \ldots, \lambda 7$. The reason for this is because the effective area adapted to the phase matching for the individual wavelengths can be more lengthwise provided in terms of the entire propagating direction as compared with the case of each of the first and second embodiments shown in FIGS. 1 and 3, respectively. Or, since all it takes is that the phase matching is obtained for the limited wavelength area, as previously stated with reference to FIG. 5A, the higher waveform conversion efficiencies can be realized in terms of the peaks in the wavelength area. It should be noted that although in the first, second and third embodiments shown in FIGS. 1, 3 and 7, respectively, as previously stated, the periodical change is exaggeratingly shown, actually, when the speckle noise is intended to be reduced, the periodical change rate of several percentages or less is enough. In addition, at this time, it is understood that since the distribution of the waveform conversion efficiencies against the respective central wavelengths are each relatively wide, when, for example, the central wavelength $\lambda 1$ is shifted to $(\lambda 1 - \Delta\lambda)$, some measure of the wavelength conversion efficiency is obtained.

Figure 9A:
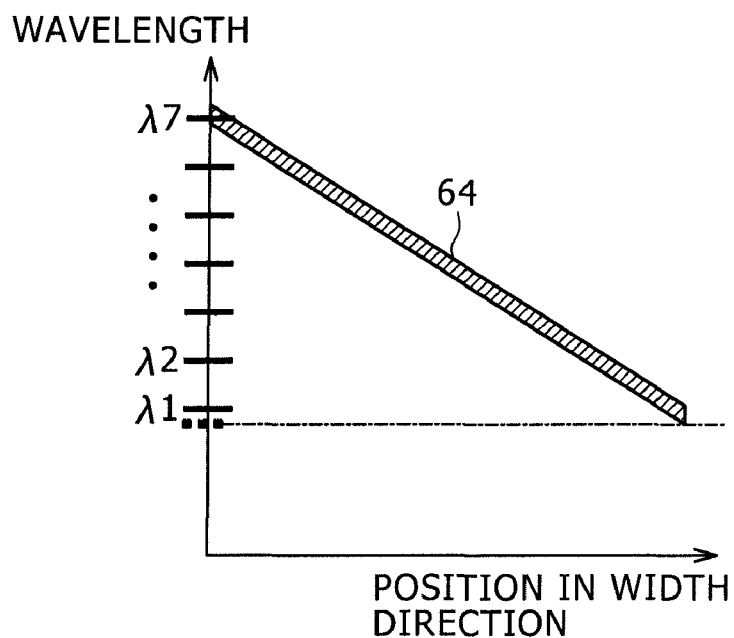
FIGS. 9A and 9B are respectively a graphical representation showing an area in which wavelength-conversion can be carried out in the laser device according to a reference example, and a graphical representation showing spectra of wavelength conversion efficiencies.

On the other hand, the case where although the periodical structure changes in the width direction, the periodical structure is constant in the propagating direction will now be discussed as a reference example. FIG. 9A shows a wavelength convertible area 64 defined between the positions in the width direction, and the light beams having the central wavelengths $\lambda 1, \lambda 2, \ldots, \lambda 7$, respectively, in this case. As can be seen from FIG. 9A, in the case of the reference example, a tolerance for the change in wavelength becomes narrower than that in the case of the third embodiment shown in FIG. 8A. The reason for this is described as follows. That is to say, in the case of the third embodiment shown in FIG. 7, the period is changed not only in the width direction, but also in the propagating direction. As a result, the third embodiment has the effect that the effective area adapted to the phase matching for a certain wavelength spreads in the width direction in terms of the entire propagating direction. Therefore, for example, when in the light beam having the central wavelength $\lambda 1$, the central wavelength $\lambda 1$ is shifted by $\Delta\lambda$ due to the change in characteristics of the semiconductor laser, the wavelength convertible area does not exist in some cases.

Figure 9B:
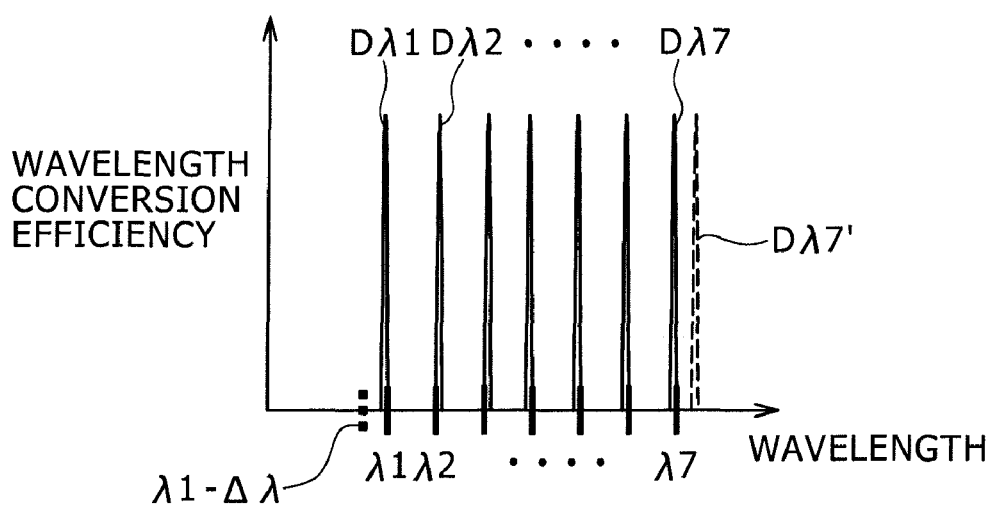

FIG. 9B shows spectra of the wavelength efficiencies in the reference example. In FIG. 9B, $D\lambda 1, D\lambda 2, \ldots, D\lambda 7$ indicated by respective solid lines show the waveform conversion efficiencies of the light beams having the central wavelengths $\lambda 1, \lambda 2, \ldots, \lambda 7$, respectively. Also, $D\lambda 7'$ indicated by a broken line shows the waveform conversion efficiency when the width position of the light beam having the central wavelength $\lambda 7$ is shifted. As can be seen from FIG. 9B, the peak values of the wavelength conversion efficiencies are each higher in the case of the reference example than in the case of the third embodiment shown in FIG. 8B. However, when the central wavelength $\lambda 1$, for example, is shifted to $(\lambda 1 - \Delta\lambda)$, there is the possibility that the wavelength conversion can be hardly carried out in this wavelength band.

In a word, when the wavelength conversion efficiency is regarded as important, and, for example, the output is especially ensured, all it takes is that the structure, such as the periodical structure, adapted to the phase matching is changed only in the width direction. Conversely, when it takes priority to simplify the wavelength change, or the optical position adjustment between the elements, it is understood that all it takes is to change the period or the like in the propagating direction as shown in FIG. 1, 3 or 7.

In particular, in the third embodiment shown in FIG. 7, the periodical structure is changed not only along the propagating direction, but also in the width direction, whereby the size of the poling region effective as the entire propagating direction can be ensured for the desired wavelength while the waveform tolerance (means the position tolerance in this case) is ensured. For this reason, as shown in FIG. 8A, it is possible to further enhance the wavelength conversion efficiencies for the light beams having the respective central wavelengths.

By the way, the beam diameters of the fundamental waves made incident to the nonlinear optical element are each finite. Thus, when as shown in FIG. 7, the poling structure changes in the width direction in addition to in the propagating direction, the poling structure changes depending on the position within the beam diameter as well.

In general, although the wavelength conversion efficiency is high as the power density of the fundamental wave is higher, due to the condensing characteristics of the Gaussian beam, as the beam is further narrows down, the diffuseness of the beam becomes large, that is, the beam spreads in a short distance. In addition, although when the beam is loosely narrowed down, the diffuseness becomes small and thus the change in beam diameter becomes small, the beam diameter becomes large all the more because the beam is loosely narrowed down. For this reason, when the element length is long, it is difficult to avoid that the beam diameter becomes large both on the front end side and on the rear end side, and thus the periodical change within the beam diameter increases. When the element length is long, normally, the beam diameter becomes large because the beam is used with the diffuseness of the beam being suitably suppressed so as to obtain the maximum conversion efficiency.

Figure 10:
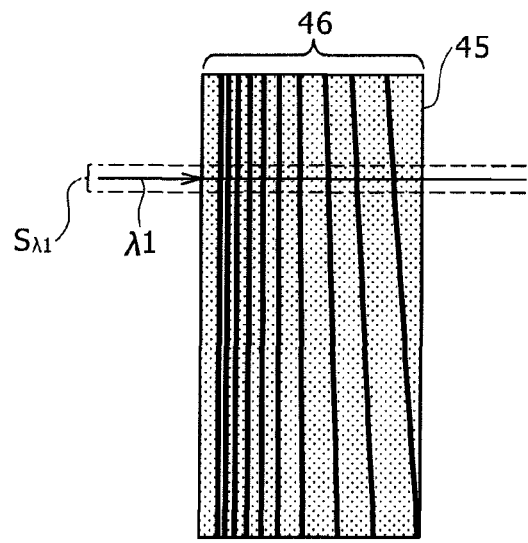
FIG. 10 is a view explaining the case where a fundamental wave having a beam width is made incident to a nonlinear optical element in the laser device according to the third embodiment of the present invention.

On the other hand, in the third embodiment, as has been described, the poling structure changes not only in the propagating direction of the fundamental waves L1, but also in the width direction. As a result, the structure of the poling period corresponding to the central wavelengths $\lambda 1, \lambda 2, \ldots, \lambda 7$ of the fundamental waves L1 changes in the propagating direction as well. For this reason, even when the beam diameter spreads, it is possible to ensure the region in the width direction adapted to the phase matching and corresponding to the spreading of the beam diameter. FIG. 10 shows a schematically structural view when the fundamental wave L1 having the central wavelength λ1 is made incidence with the spot diameter Sλ1 to the nonlinear optical element 45 shown in FIG. 7. As shown in FIG. 10, the poling period changes not only in the width direction, but also in the propagating direction over the entire range to which the fundamental wave L1 having the central wavelength λ1 is made incidence with the spot diameter Sλ1. For this reason, the range in which the central wavelength λ1 can be wavelength-converted is spread within the region of the spot diameter Sλ1. That is to say, the effective range, as the entire propagating direction, existing within the propagating path of the light beam becomes wide, in other words, the width direction region adapted to the phase matching becomes wide as compared with the case where the periodical structure does not change in the propagating direction, but changes only in the width direction. Thus, it can be said that the region for the wavelength conversion can be widened.

For example, there is conceivable the case where the refractive index period of the Bragg reflection structure 43 in the third embodiment shown in FIG. 7 is abruptly changed in the width direction, thereby generating the laser beams having the wide wavelength change width. Even in such a case, the period is suitably changed both in the width direction and in the propagating direction in the manner as described above, whereby when the wavelengths of the fundamental waves L1 changes in the width direction, the pseudophase matching condition can be met for the entire light beams each having the relatively large beam diameter.

Although the third embodiment shown in FIG. 7 adopts the poling structure having the period which gradually changes both in the width direction and in the propagating direction, a structure may also be adopted such that regions having respective constant periods are coupled to one another so that the period changes little by little both in the width direction and in the propagating direction.

Note that, since the wavelength conversion efficiency, as described above, depends on the effective length meeting the pseudophase matching condition of the propagating optical path, it can not be said that the wavelength conversion efficiency is indiscriminately enhanced. In a word, it can be said that the change rates both in the propagating direction and in the width direction may be suitably selected in consideration of the sizes and wavelength ranges of the light beam diameters, the range of the phase matching condition for the periodical structure or the like corresponding thereto, and the demanded conversion efficiency or the like.

4. Fourth Embodiment (The Case where Either the Initial Phase or the Poling Duty of the Poling Changes in the Propagating Direction)

In a fourth embodiment of the present invention, a description will be given below with respect to the case where either the initial phase or the poling duty of the poling structure changes in the propagating direction.

Figure 11:
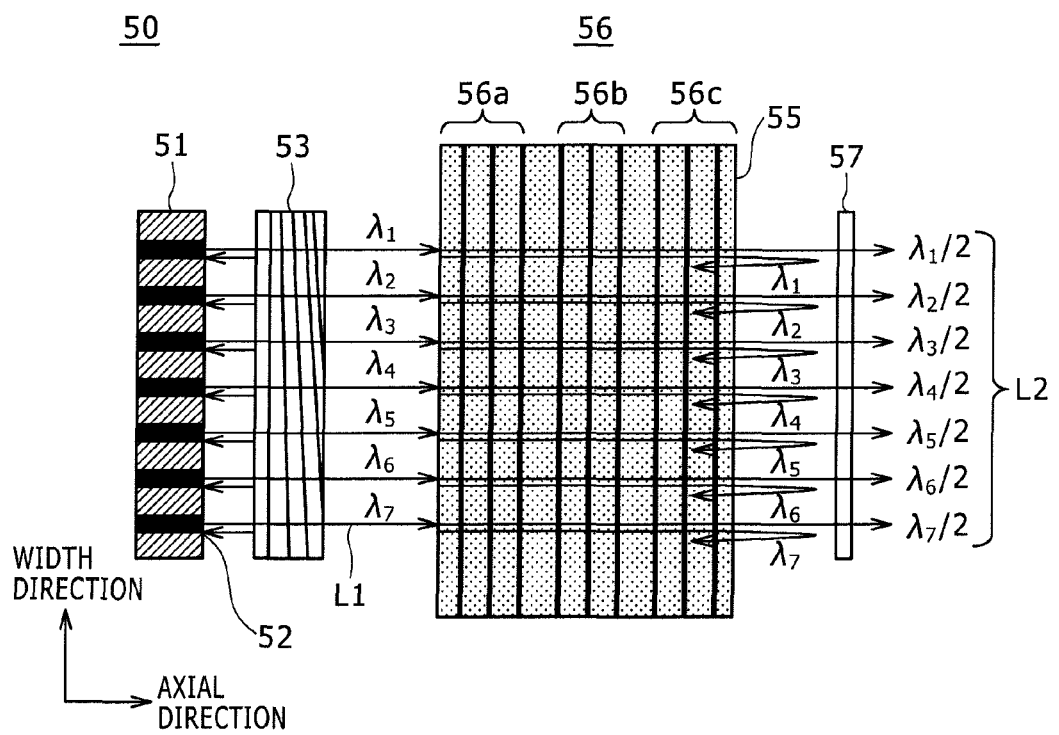
FIG. 11 is a schematic view showing a structure of a laser device according to a fourth embodiment of the present invention.

FIG. 11 is a schematic view showing a structure of a laser device relating to the case where the initial phase of the poling of the nonlinear optical element is changed while the period of the poling structure is held constant.

The laser device 50 shown in FIG. 11 includes a fundamental wave generating portion 54 composed of a semiconductor laser 51 and a Bragg reflection structure 53. In the case, the semiconductor laser 51 is composed of a semiconductor laser array or the like and has a plurality of luminous points 52. Also, the Bragg reflection structure 53 stabilizes laser beams emitted from the semiconductor laser 51 into a plurality of fundamental waves L1 having respective wavelengths λ1, λ2, . . . , λ7 which are different from each other in at least one set thereof. In addition, the laser device 50 includes a nonlinear optical element 55 and a filter 57. In this case, the nonlinear optical element 55 has a poling structure 56 composed of poling regions 56a, 56b and 56c meeting the pseudophase matching condition for a plurality of fundamental waves L1 generated in the fundamental generating portion 54. Also, the filter 57 transmits the second-order harmonics L2 and the like, and reflects the fundamental waves.

As shown in FIG. 11, the fourth embodiment of the present invention adopts a structure such that the initial phase of the poling is shifted every poling region of the poling regions 56a, 56b and 56c in the nonlinear optical element 55.

Figure 12:
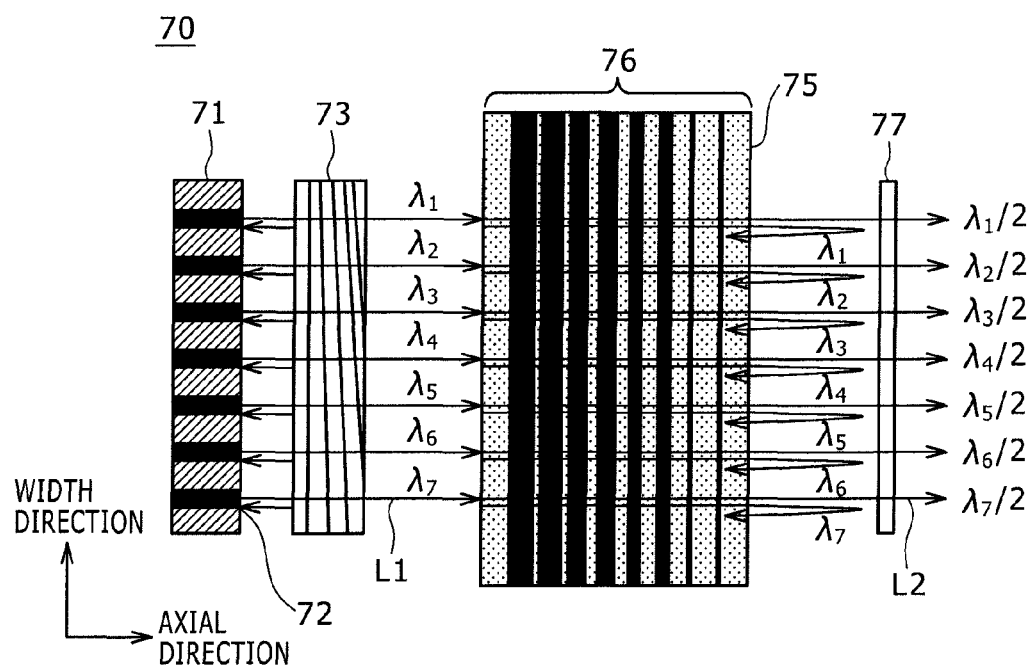
FIG. 12 is a schematic view showing a structure of a laser device according to a change of the fourth embodiment of the present invention.

In addition thereto, as shown in FIG. 12, the duty ratio of the poling structure 76 of the nonlinear optical element 75 may be changed along the propagating direction. A laser device 70, as a change of the fourth embodiment, shown in FIG. 12 includes a fundamental wave generating portion 74 composed of a semiconductor laser 71 and a Bragg reflection structure 73. In the case, the semiconductor laser 71 is composed of a semiconductor laser array or the like and has a plurality of luminous points 72. Also, the Bragg reflection structure 73 stabilizes laser beams emitted from the semiconductor laser 71 into a plurality of fundamental waves L1 having respective wavelengths λ1, λ2, . . . , λ7 which are different from each other in at least one set thereof. In addition, the laser device 70 includes a nonlinear optical element 75 and a filter 77. In this case, the nonlinear optical element 75 has a poling structure 76 meeting the pseudophase matching condition for a plurality of fundamental waves generated in the fundamental generating portion 74. Also, the filter 77 transmits the second-order harmonics L2 and the like and reflects the fundamental waves.

Even when the initial phase of the poling structure is changed, and the duty ratio is changed in the manner described above, it is possible to obtain the same effect as that in the case where the period changes. Therefore, the pseudophase matching condition can be met for a plurality of fundamental waves L1 having the respective wavelengths λ1, λ2, . . . , λ7. In addition, the changes of the phase and the duty ratio, and the periodical change may be suitably combined with each other, and moreover such changes can also be made in the width direction.

5. Fifth Embodiment (The Case Relating to the Disposition of the Bragg Reflection Structure)

Figure 13:
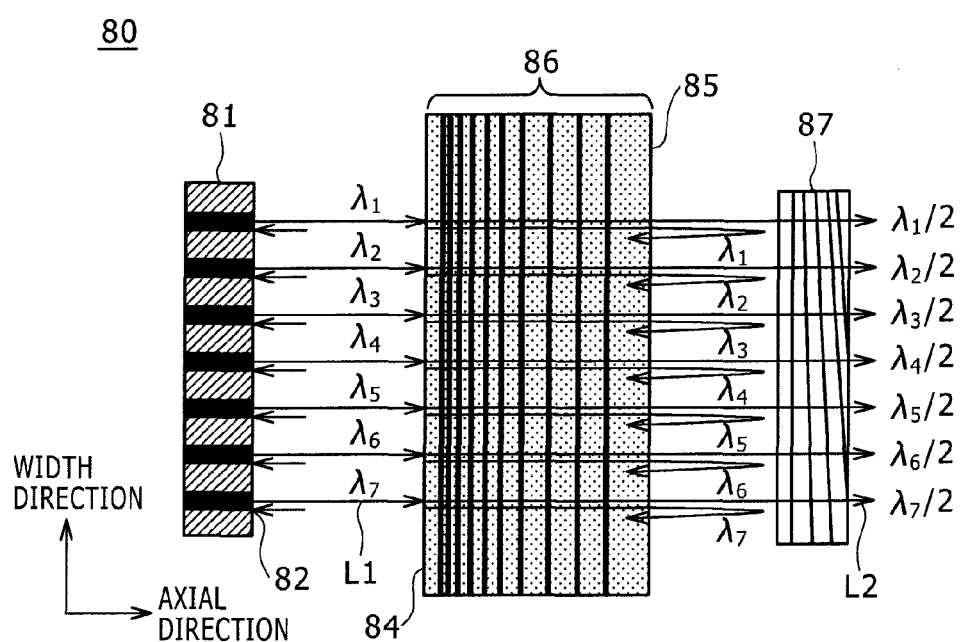
FIG. 13 is a schematic view showing a structure of a laser device according to a fifth embodiment of the present invention.

FIG. 13 is a schematic view showing a structure of a laser device according to a fifth embodiment of the present invention. As shown in FIG. 13, in a laser device 80 of the fifth embodiment, a nonlinear optical element 85 is disposed between a semiconductor laser 81 and a Bragg reflection structure 87, thereby obtaining internal resonance type wavelength conversion. The Bragg reflection structure 87 is structured so as to have the strong reflection function against the functional waves L1 having the respective central wavelengths λ1 to λ7, and so as to transmit the second-order harmonics L2 having the respective wavelengths λ1/2 to λ7/2. As a result, the light beam(s) which is (are) left without being converted into the second-order harmonic(s) L2 within the nonlinear optical element 85 is (are) reflected by Bragg reflection structure 87 to return back to the nonlinear optical element 85 again and thus can be reutilized.

In addition, a wavelength selective film 84 which has a high transmittance function for the fundamental waves L1 having the respective central wavelengths λ1 to λ7, and a high reflection function against the second-order harmonics is provided on the semiconductor laser 81 side of the nonlinear optical element 85. When the fundamental waves L1 which are reflected by the Bragg reflection structure 87 to return back to the nonlinear optical element 85 again are converted into the second-order harmonics in the respective return optical paths, the resulting second-order harmonics are reflected by the wavelength selective film 84 again. In addition, the remaining fundamental wave(s) (each) not converted into the second-order harmonic(s) is (are) transmitted through the wavelength selective film 84 to return back to the semiconductor laser 81 to be locked therein.

By adopting such a structure, the second-order harmonics L2 which are generated in two directions within the nonlinear optical element 85 can be justified in one direction to be taken out. In addition, it is possible to prevent such harmonics from being made incident to the semiconductor laser 81 to damage the semiconductor laser 81.

It should be noted that although in the fifth embodiment of the present invention, the case where the poling period and the poling duty changes has been shown in terms of the poling structure 86 provided in the nonlinear optical element 85, the present invention is by no means limited thereto. That is to say, it is possible to adopt any of the various structures which were described in the second to fourth embodiment described above. Also, at least any one of the poling period, the poling initial phase or the poling duty ratio is changed in the propagating direction of the fundamental waves L1, whereby the fundamental waves L1 having the different wavelengths λ1 to λ7 can be efficiently converted with the simple structure similarly to the case of each of the first to fourth embodiments described above.

In addition, a structure may also be adopted such that the poling period, the poling initial phase or the poling duty ratio is changed not only in the propagating direction of the fundamental waves L1, but also in the width direction. In this case as well, since the fifth embodiment adopts the structure that the period and the like change in the propagating direction as well of the light beams, even when there is the position shift, the pseudophase matching condition can be necessarily met during the propagation of the light beams irrespective of the sizes of the beam diameters.

6. Sixth Embodiment (The Case where the Bragg Reflection Structure and the Nonlinear Optical Element are Integrated with Each Other)

In the sixth embodiment of the present invention, there is shown the case where the Bragg reflection structure is provided in a part of the nonlinear optical element. Application of a minute strain makes it possible to cause a refractive index difference between the polarization domains in an interface between the polarization domains. More effectively, it is preferable that the periodical structure is formed by the poling, electrodes are mounted to surfaces between which the optical path direction of the fundamental waves is sandwiched, an electric field is applied across the electrodes, and the refractive index change is caused every inversion period by the electrooptic effect.

FIG. 14 is a schematic view showing a structure of a laser device 90 according to the sixth embodiment of the present invention. The laser device 90 is composed of a semiconductor laser 91, a nonlinear optical element 95, and a filter 97. In this case, the semiconductor laser 91 is composed of a semiconductor laser array or the like having a plurality of luminous points 92. The nonlinear optical element 95 is integrated with a Bragg reflection structure 93. Also, the filter 97 transmits the second-order harmonics L2 and the like and reflects the fundamental waves L1. The nonlinear optical element 95 includes a poling region 96a composing the Bragg reflection structure 93, and a poling region 96b meeting the pseudophase matching condition for the fundamental waves L1. The Bragg reflection structure 93 stabilizes the laser beams emitted from the semiconductor laser 91 into a plurality of fundamental waves L1 having the respective wavelengths λ1 to λ7 which are different from each other in at least one set thereof. Also, the poling region 96b of the nonlinear optical element 95 has such a structure as to meet the pseudophase matching condition for a plurality of fundamental waves L1 thus generated.

In the sixth embodiment of the present invention shown in FIG. 14, a voltage is periodically applied across the electrodes mounted to both the surfaces of the nonlinear optical element 95, respectively, to form the Bragg reflection structure 93 with the electrodes, thereby causing a difference in refractive index between the region having the electrodes and the region having no electrode. In this case, the poling region 96b may not be formed in the portion 96a used as the Bragg reflection structure.

When no electrode is used, a structure may also be adopted such that the refractive index difference is periodically generated by the photorefractive effect, for example, caused by the interference exposure. The Bragg condition under which the light is approximately, vertically reflected is approximately expressed by Expression (1):

$$\Lambda 0 = n\lambda/2 \tag{1}$$

where $\Lambda 0$ is a period of the refractive index difference, n is a natural number, and $\lambda$ is a wavelength.

Thus, in the above case, all it takes is that a value of the order, n, is selected while the easiness or the like of the manufacture is taken into consideration, thereby determining the period. Of course, in any case, either the poling period of the poling region 96b, or the electrode period is changed in the width direction, and thus the laser beams emitted from the semiconductor laser array 91 are stabilized into a plurality of fundamental waves L1 having the desired wavelength band.

By adopting such a structure, the number of components or parts is reduced, and the work for adjusting the optical positions of the individual portions is simplified. Therefore, it is possible to provide the laser device 70 which is readily manufactured and which has the wide wavelength width.

In addition thereto, the periodical ion doping or the like is carried out, thereby making it possible to cause the refractive index change. Also, a grating shape may be formed in the nonlinear optical element 95 by carrying out the etching or the like. In this case as well, it is possible to realize the periodical change of the refractive index.

7. Seventh Embodiment (The Case where a Semiconductor Laser Having a Longitudinal Multimode is Used)

Next, a description will be given below with respect to a seventh embodiment of the present invention in which a semiconductor laser having a longitudinal multimode is used instead of using the semiconductor laser for emitting the laser beams which are stabilized in turn by the Bragg reflection structure. In this case, a structure can be adopted such that the laser beams are repetitively reflected in different optical paths within the nonlinear optical element, thereby changing the converted wavelengths of the laser beams little by little. By adopting such a structure, regions adapted to the phase matching for the light beams having the respective wavelengths can be provided in different regions in paths through which the light beams of the longitudinal multimode are propagated, respectively. In a word, the interaction with the light beams having the different wavelengths can be lightened in the regions in which the light beams having the respective wavelengths are wavelength-converted.

FIG. 15 is a schematic view showing a structure of a laser device 100 according to the seventh embodiment of the present invention. The laser device 100 of the seventh embodiment is composed of a semiconductor laser 101 having the longitudinal multimode, and a nonlinear optical element 105. In this case, the nonlinear optical element 105 is disposed along an emission direction of a fundamental wave L1 emitted from a luminous point 102 of the semiconductor laser 101. The nonlinear optical element 105 is disposed obliquely with respect to the traveling direction of the fundamental wave L1 so that a normal direction of each of a surface 105A and a surface 105B to and from which the fundamental wave L1 is made incident and emitted is slightly deviated from the traveling direction of the fundamental wave L1.

Also, a fundamental wave incidence portion 103 is provided in a position, to which the fundamental wave L1 is made incident from the outside, of the incidence surface 105A of the nonlinear optical element 105. Also, an antireflection film or the like for providing a high transmittance function for the fundamental wave L1 is provided on the fundamental wave incidence portion 103. However, a structure may also be adopted such that the antireflection film is not simply provided on the fundamental wave incidence portion 103 as long as the necessary transmission property is obtained in the fundamental wave incidence portion 103. A reflective film 107 against both the fundamental wave L1 and second-order harmonics L2 is formed on a surface, of the incidence surface 105A, other than the portion having the fundamental wave incidence portion 103 formed thereon. In addition, a selectively transmissive film 108 which transmits the harmonics such as the second-order harmonics L2, and reflects the fundamental wave L1 is formed on the emission surface 105B.

In addition, as has been described, each of the incidence surface 105A and the emission surface 105B of the nonlinear optical element 105 is inclined in such a way that the normal line thereof is slightly deviated from the traveling direction of the fundamental wave L1 emitted from the semiconductor laser 101 having the longitudinal multimode. By adopting such a structure, the fundamental wave L1 made incident to the fundamental wave incidence portion 103 is repetitively reflected between the emission surface 105B and the incidence surface 105A in different paths within the nonlinear optical element 105. The number of reflection needs to be suitably selected so as to correspond to the desired wavelength range.

Moreover, the poling structure 106 within the nonlinear optical element 105 is structured in such a way that the period thereof changes little by little along the paths of the light beam which is reflected within the nonlinear optical element 105 to travel in the different directions. In other words, the poling structure 106 is structured in such a way that the poling period changes both in the propagating direction and in the width direction so that the period continuously changes with respect to the optical paths of the light beam repetitively reflected.

Of the light beam made incident to the fundamental wave incidence portion 103, a part of the light beam which is not converted into the harmonics in an outward way thereof is reflected by the selectively transmissive film 108 of the nonlinear optical element 105, and travels along the optical path in which the poling period changes in the different paths toward the reflective film 107. Then, when the period meeting the pseudophase matching exists within the optical path in a path d2 along which the light beam concerned is reflected by the reflective film 107 to return back to the emission surface 105B of the nonlinear optical element 105, the light beam concerned which is thus converted into the harmonic is emitted to the outside through the emission surface 105B. On the other hand, when the period meeting the pseudophase matching does not exist, the light beam concerned is reflected by the selectively transmissive film 108 again to travel along an optical path d3. Thereafter, this operation is repetitively carried out, so that second-order harmonics L2 obtained based on the fundamental waves, for example, having the respective central wavelengths λ1 to λ7 in terms of the range of the wavelength band of the fundamental wave L1 emitted from the longitudinal-multimode semiconductor laser 101 and having the central wavelengths λ1/2 to λ7/2 are emitted to the outside through the emission surface 105B.

As has been described, the seventh embodiment of the present invention adopts the structure that the light beams having the respective central wavelengths λ1 to λ7 are wavelength-converted through the different propagating paths. Therefore, it is possible to lighten the interaction resulting from that the converted waves having the different wavelengths, respectively, exist in the same region. As a result, it is possible to either enhance the conversion efficiency or suppress the reduction of the conversion efficiency.

In addition, in this way, in the seventh embodiment of the present invention, it is possible to reutilize any of the light beams which are not wavelength-converted. For this reason, it is possible to enhance the utilization efficiency of the light beam. In addition, since the optical path length within the nonlinear optical element 105 can be made very long as compared with the case of any of the first to sixth embodiments, a large number of poling periods can be disposed for the incident light beam. Or, each of the poling structure is made long or the poling period is gradually changed, thereby making it possible to obtain the high conversion efficiency. For this reason, even in the case of the light source having the wide wavelength width as with the longitudinal multimode, the pseudophase matching condition is soon met while the light beam is propagated back and forth multiple times within the nonlinear optical element 105, thereby making it possible to convert the light beam concerned into the second-order harmonics L2 with the high efficiency. Therefore, making comparison with the spectra of the wavelength conversion efficiency shown in FIG. 6B, the conversion efficiency can be obtained within the same wavelength band, and a value thereof can be increased. That is to say, it is possible to obtain such an effect as to enhance the optical characteristics of the entire graph shown in FIG. 6B.

In addition, in this case, in the poling structure 106 within the nonlinear optical element 105, it is possible to form the poling region in which the same conversion rate is not set on one side in the width direction, but the different conversion rates are set. Or, it is also possible to increase or decrease the conversion rate in the propagating direction in the poling structure 106. By adopting such a structure, the optical path length necessary for all the light beams having the respective wavelengths to meet the pseudophase matching condition, that is, the polarization period can be ensured with the thinner thickness. For this reason, it is possible to thin the thickness of the nonlinear optical element 105 all the more, and thus the entire laser device 100 can be miniaturized.

In addition, in the seventh embodiment of the present invention, it is to be understood that the time coherency is reduced due to the wide wavelength width as described above, which is advantageous to the reduction of the speckle noise. In addition thereto, it is also possible to reduce the coherency among a plurality of light beams outputted. In other words, it can be said that the space coherence is very low. This has an advantage that an interference pattern hardly appears and the handling becomes very easy even in the case where in shaping the light beam, the light beam is split and synthesized in an optical element such as an integrator to be shaped into a top hat shape, that is, to be shaped into such an intensity distribution shape as to have a given width and a given intensity.

By the way, when the fundamental wave L1 is propagated multiple times within the nonlinear optical element 105 in such a way, the beam diameter is hardly held constant due to the condensing characteristics of the Gaussian beam because the propagating distance becomes long. However, as described above, the waveform conversion efficiency becomes high as the power density of the fundamental wave is higher. For this reason, it is optimal for the nonlinear optical element 105 in the structure of the seventh embodiment to adopt a slab waveguide structure having a confinement structure for the fundamental wave L1 only in the direction vertical to the propagating direction (vertical to the paper of FIG. 15) of the fundamental wave L1.

By adopting such a structure, it is possible to suppress that the fundamental wave L1 within the nonlinear optical element 105 is diffused, and it is possible to highly hold the power density of the fundamental wave L1 over the entire propagating path length. In addition, it is possible to highly hold the wavelength conversion efficiency for all the wavelengths of the fundamental wave L1.

It is noted that although in the seventh embodiment shown in FIG. 15, the description has been given with respect to the case where the nonlinear optical element 105 having an approximate quadrangle in cross section is disposed obliquely with respect to the propagating direction, the present invention is by no means limited thereto. That is to say, a structure may also be adopted such that the nonlinear optical element 105, for example, is changed in shape from the quadrangle, whereby the fundamental wave L1 is reflected in an oblique direction to be propagated within the nonlinear optical element 105. Each of the incidence surface 105A and the emission surface 105B may not be formed as a flat surface, but may be formed as an incline. In this case, each of the incidence surface 105A and the emission surface 105B has a triangle, a rhombus or a circular arc in cross section.

Or, each of the incidence surface 105A and the emission surface 105B, for example, may have a step-like shape. Thus, various kinds of changes can be made for adjustment of the propagating direction.

In addition, of course, the selectively transmissive film 108 may be provided with a portion having a highly reflective function against the second-order harmonics L2 as well as the fundamental wave L1. In this case, there is provided an advantage that a portion having a highly reflective function against the fundamental wave L1, and a highly transmissive function for the second-order harmonics L2 is provided in a final stage, whereby all the second-order harmonics L2 generated can be outputted, and thus the subsequent beam shaping is readily carried out.

8. Eighth Embodiment (A Laser Display Apparatus)

Next, a laser display apparatus according to an eighth embodiment of the present invention will be described.

Figure 16:
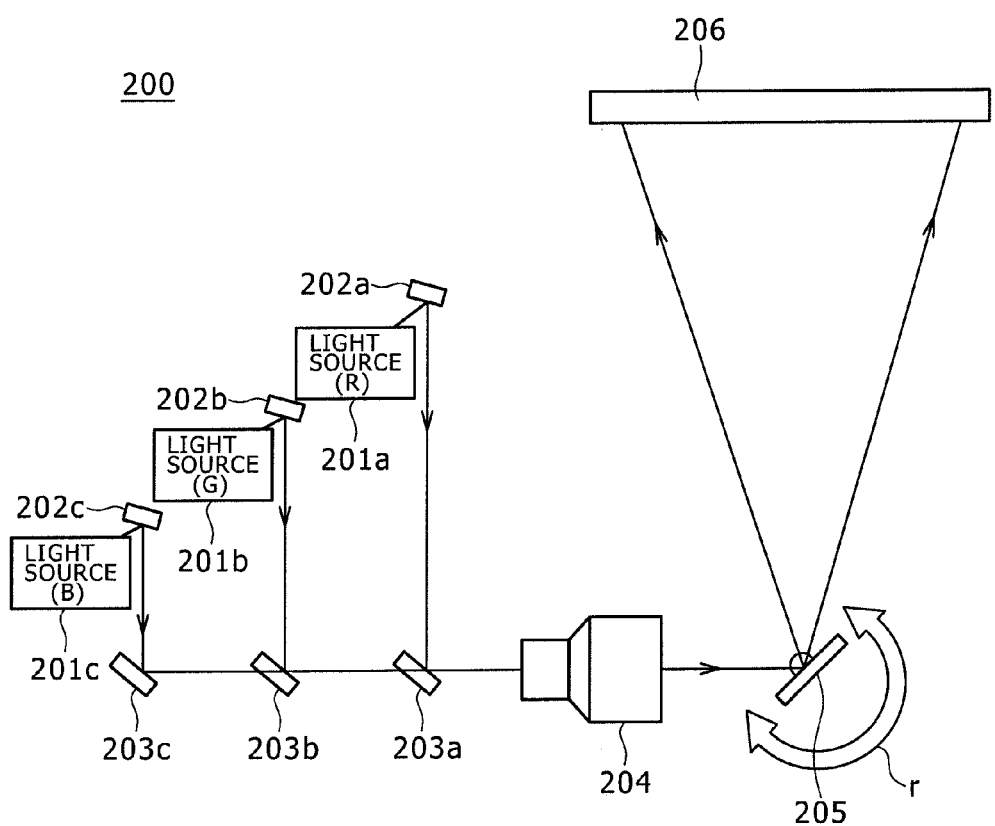
FIG. 16 is a schematic diagram showing a construction of a laser display apparatus according to an eighth embodiment of the present invention.

FIG. 16 is a schematic diagram showing a construction of a laser display device 200. The laser display device 200 includes light sources 201a, 201b and 201c as light sources for emitting a red (R) laser beam, a green (G) laser beam and a blue (B) laser beam, respectively. In this case, the laser device according to the present embodiment is used as the light source 201b for emitting the green laser beam. The laser device may adopt the structure of any of the first to seventh embodiments of the present invention described above. The red, green and blue laser beams emitted from the red, green and blue light sources 201a, 201b and 201c are reflected by optical switching arrays (optical modulating portions) 202a, 202b and 202c, respectively. The red, green and blue laser beams thus reflected are condensed by a projection lens (projection optical system) through dichroic mirrors 203a, 203b and 203c, respectively. Also, the red, green and blue laser beams condensed by the projection lens 204 are scanned by a scanning element 205 such as a galvano-mirror or a polygon mirror to be projected as a two-dimensional image on a screen 206.

In such a laser display apparatus 200, since the laser device according to the present embodiment is used as the green light source 201b, the green laser beam of the second-order harmonics can be emitted with the high efficiency and the low power consumption. In addition, since the emitted laser beam having the wide wavelength width is obtained with the laser device according to the present embodiment, the present embodiment is applied to such a laser display apparatus 200, thereby making it possible to reduce the speckle noise. As a result, the laser display apparatus 200 of the eighth embodiment can display thereon a clean and high-quality image.

It is noted that a two dimensional modulation element such as a liquid crystal display element may be used instead of using both the optical modulation portions 202a, 202b and 202c and the scanning element 205. In addition, the optical modulation portions 202a, 202b and 202c are not provided in positions after emission from the red, green and blue light sources 201a, 201b and 201c, but may be included within the red, green and blue light sources 201a, 201b and 201c instead. Thus, for example, a structure or the like may also be adopted such that a modulation signal corresponding to image information is inputted to a driving portion of the semiconductor laser used as the light source.

9. Ninth Embodiment (A Laser Printer Apparatus)

Figure 17:
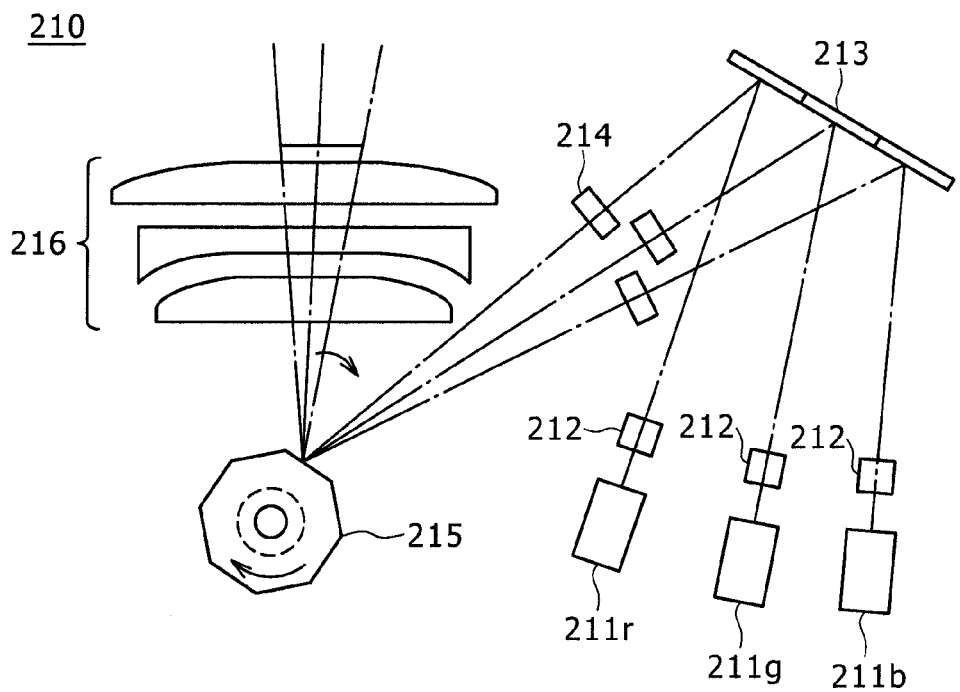
FIG. 17 is a schematic diagram showing a construction of a laser radiating apparatus according to a ninth embodiment of the present invention.

A description will be given hereinafter with respect to a laser printer apparatus as a laser radiating apparatus according to a ninth embodiment of the present invention. As shown in FIG. 17, a red laser device 211r, a green laser device 211g structured according to the present embodiment, and a blue laser device 211b are disposed as laser light sources in the laser printer apparatus 210. Any of various structures described in the first to eighth embodiments can be adopted as the device structure of the green laser apparatus 211g.

In addition, in the laser printer apparatus 210, modulation elements 212 such as acoustooptic modulation elements for adjusting the output powers are disposed on optical paths of red, green and blue laser beams emitted from the red laser device 211r, the green laser device 211g and the blue laser device 211b, respectively. Moreover, a mirror 213 and a lens 214 are provided in the laser printer apparatus 210. In this case, the mirror 213 reflects the red, green and blue laser beams adjusted by the respective modulation elements 212. Also, the lens 214 condenses the laser beams reflected by the mirror 213. In addition, a scanning element 215 composed of a polygon mirror or a galvano-mirror, and a lens group 216 are disposed in the laser printer apparatus 210. In this case, the scanning element 215 scanning the red, green and blue laser beams by reflecting the red, green and blue laser beams condensed by the lens 214. The lens group 216 corrects aberrations of the red, green and blue laser beams thus scanned. In such a manner, the laser printer apparatus 210 is constructed.

The red, green and blue laser beams emitted from the red laser device 211r, the green laser device 211g and the blue laser device 211b, respectively, are adjusted in intensities thereof by the respective modulation elements 212 and are reflected by the mirror 213. The red, green and blue laser beams thus reflected are condensed on a reflecting surface of the scanning element 215. Also, the laser beams reflected by the scanning element 215 are adjusted in aberrations thereof, which are changed by the scanning angles of the red, green and blue laser beams, on a surface to be radiated such as a photographic printing paper in advance, and are then emitted.

With such a laser printer apparatus 210, since the green laser device 211g structured according to the present embodiment is used, the light emission can be carried out with the high efficiency, and thus the low power consumption can be realized.

In addition, when, for example, an image is drawn by using the laser radiating apparatus as described above, since the coherency of the emitted laser beams is low, the light intensity distribution on the surface to be radiated is unified, and thus it is possible to draw the cleaner image. In the ninth embodiment as well, similarly to the case of the laser display apparatus 200 described above, the optical modulation portion is not provided in a position after emission of the laser beam from the light source, but may be provided in the light source itself.

10. Tenth Embodiment (An Exposure Apparatus)

Figure 18:
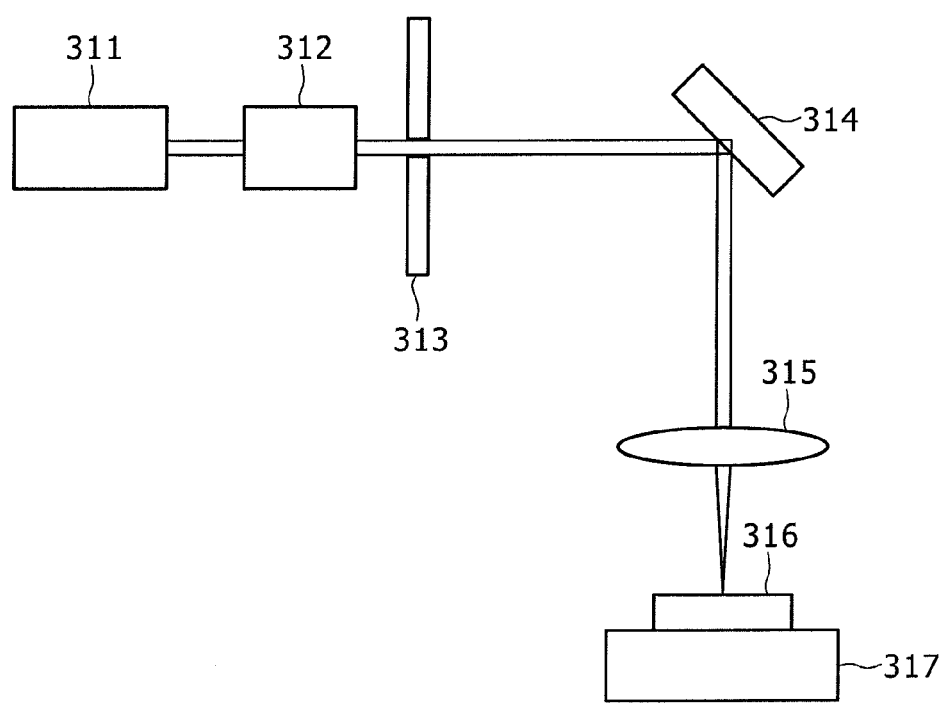
FIG. 18 is a schematic diagram showing a construction of a laser radiating apparatus according to a tenth embodiment of the present invention.

FIG. 18 is a schematic diagram showing a construction of an exposure apparatus as a laser radiating apparatus according to a tenth embodiment of the present invention. A laser device 311 having any of the various structures described in the first to seventh embodiments is used as a laser light source. Also, a laser beam emitted from the laser device 311 is adjusted in output power thereof by a variable attenuator 312, and is then shaped by a mask 313.

The laser beam thus shaped is reflected by a mirror 314 to be made incident to a condenser lens 315, thereby being condensed on a surface of a body 316 to be radiated which is disposed on a placing section 317. In this case, the placing section 317 includes a moving section which is movable in a horizontal direction, in a vertical direction, and the like. In such a manner, a laser radiating apparatus 300, including the laser device 311 according to any of the first to seventh embodiments of the present invention is used as an exposure light source for a resist or the like, whereby since incoherency of the emitted laser beam is high, it is possible to unify the light intensity distribution on the radiated area, and thus it is possible to reduce the exposure nonuniformity.

11. Eleventh Embodiment (A Nonlinear Optical Element)

The nonlinear optical element 15 according to an eleventh embodiment of the present invention includes: the Bragg reflection structure 13 including the periodical structure meeting the Bragg reflection condition for a plurality of fundamental waves L1 having wavelengths λ1 to λ7 different from one another; and the poling structure 16 in which the poling region adapted to pseudophase matching for the wavelengths of the plurality of fundamental waves L1 in the propagating directions of the plurality of fundamental waves L1 is variatively formed along the propagating directions of the plurality of fundamental waves L1, and the plurality of fundamental waves L1 are converted into the harmonics, respectively, through the pseudophase matching.

It should be noted that the present invention is by no means limited in constitution to the first to eleventh embodiments described above. That is to say, for example, an antireflection film or a wavelength selective film is provided on the incidence surface or the like of the Bragg reflection structure or the nonlinear optical element as may be necessary, or any other suitable optical element may also be added. For example, an optical element, such as a lens, having various beam shaping operations may be provided in a position before the nonlinear optical element, or an optical element for shaping a beam shape may be provided in a position after emission of the converted wave. In this way, the various changes and modifications can be made without departing from the gist of the present invention.

The present application contains subject matter related to that disclosed in Japanese Priority Patent Application JP 2009-047028 filed in the Japan Patent Office on Feb. 27, 2009, the entire content of which is hereby incorporated by reference.

What is claimed is:

1. A laser device, comprising:
a fundamental wave generating portion configured to generate a plurality of fundamental waves having wavelengths which are different from each other in at least one set thereof, said fundamental wave generating portion having a semiconductor laser having a plurality of luminous points, and a Bragg reflection structure; and
a nonlinear optical element in which a poling structure adapted to pseudophase matching for the wavelengths of the plurality of fundamental waves emitted from said fundamental wave generating portion, respectively, is formed variatively along a propagating direction of the plurality of fundamental waves, the nonlinear optical element being formed such that inversion and non-inversion of the polarization direction is repeated with a predetermined period and a pseudophase matching condition changes in a propagating direction of the fundamental waves.

2. The laser device according to claim 1, wherein said poling structure has a structure in which at least any one of a poling period, a poling duty or a poling initial phase changes along the propagating directions of the plurality of respective fundamental waves.

3. The laser device according to claim 1, wherein said poling structure includes a structure in which a plurality of poling regions are coupled to one another along the propagating direction of the laser beams; and
said plurality of poling regions have respective constant poling periods, and the periods are different from each other in at least one set thereof.

4. The laser device according to claim 1, wherein said plurality of luminous points of said semiconductor laser are linearly arranged;
said Bragg reflection structure includes a periodical structure in which a reflection wavelength changes along the arrangement direction of said luminous points; and
said poling structure includes a periodical structure in which the period changes along an arrangement direction of said plurality of luminous points of said semiconductor laser.

5. The laser device according to claim 1, wherein said poling structure is a structure in which a wavelength band in which wavelength conversion is carried out based on pseudophase matching contains a wavelength band of the plurality of entire fundamental waves.

6. The laser device according to claim 1, wherein said Bragg reflection structure is a structure in which a reflectivity is higher against the plurality of fundamental waves than against harmonics, and a transmittance is higher for the harmonics than for the plurality of fundamental waves.

7. The laser device according to claim 6, wherein said nonlinear optical element is disposed between said semiconductor laser and said Bragg reflection structure, and includes a wavelength selective film in which the transmittance is higher for the plurality of fundamental waves than for the harmonics, and the reflectivity is higher against the harmonics than against the plurality of fundamental waves.

8. The laser device according to claim 1, wherein said Bragg reflection structure is formed in a part of said nonlinear optical element.

9. The laser device according to claim 8, wherein said Bragg reflection structure is formed as electrodes which modulates a refractive index based on an electrooptic effect.

10. The laser device according to claim 8, wherein an electrode portion composed of an electrode structure having a plurality of period meeting a Bragg reflection condition is provided in a region composing said Bragg reflection structure of said nonlinear optical element.

11. A laser display apparatus, comprising:
a light source including a laser device including
a fundamental wave generating portion configured to generate a plurality of fundamental waves having wavelengths which are different from each other in at least one set thereof, said fundamental wave generating portion having a semiconductor laser having a plurality of luminous points, and a Bragg reflection structure, and
a nonlinear optical element in which a poling structure adapted to pseudophase matching for the wavelengths of the plurality of fundamental waves emitted from said fundamental wave generating portion, respectively, is formed variatively along a propagating direction of the plurality of fundamental waves;
an optical modulation portion configured to control a light emitted from said light source so as to correspond to a signal; and
a projection optical system configured to output a modulation light obtained through optical modulation to an outside, the nonlinear optical element being formed such that invention and non-inversion of the polarization direction is repeated with a predetermined period and a pseudophase matching condition changes in a propagating direction of the fundamental waves.

12. A laser radiating apparatus, comprising:
a light source including a laser device including
a fundamental wave generating portion configured to generate a plurality of fundamental waves having wavelengths which are different from each other in at least one set thereof, said fundamental wave generating portion having a semiconductor laser having a plurality of luminous points, and a Bragg reflection structure, and
a nonlinear optical element in which a poling structure adapted to pseudophase matching for the wavelengths of the plurality of fundamental waves emitted from said fundamental wave generating portion, respectively, is formed variatively along a propagating direction of the fundamental waves, the non-linear optical element being formed such that inversion and non-inversion of the polarization direction is repeated with a predetermined period and a pseudophase matching condition changes in a propagating direction of the fundamental waves.

* * * * *